United States Patent
Bolbocianu et al.

(10) Patent No.: US 9,417,099 B2
(45) Date of Patent: Aug. 16, 2016

(54) WIDE ACTIVATION ANGLE PINCH SENSOR SECTION

(71) Applicant: MAGNA CLOSURES INC., Newmarket (CA)

(72) Inventors: Liviu Bolbocianu, North York (CA); Rade Isailovic, North York (CA); Mirko Pribisic, North York (CA); Thomas Mellary, East Gwillimbury (CA); Alex Porat, Thornhill (CA)

(73) Assignee: MAGNA CLOSURES INC., Newmarket (CA)

( * ) Notice: Subject to any disclaimer, the term of this patent is extended or adjusted under 35 U.S.C. 154(b) by 0 days.

(21) Appl. No.: 14/963,620

(22) Filed: Dec. 9, 2015

(65) Prior Publication Data

US 2016/0084675 A1    Mar. 24, 2016

Related U.S. Application Data

(60) Division of application No. 13/949,203, filed on Jul. 23, 2013, now Pat. No. 9,234,979, which is a continuation-in-part of application No. 12/963,359, filed on Dec. 8, 2010, now Pat. No. 8,493,081.

(60) Provisional application No. 61/791,472, filed on Mar. 15, 2013, provisional application No. 61/267,574, filed on Dec. 8, 2009.

(51) Int. Cl.
*G01D 5/16* (2006.01)
*G01D 11/30* (2006.01)
(Continued)

(52) U.S. Cl.
CPC .................. *G01D 5/16* (2013.01); *B60J 5/0493* (2013.01); *E05F 15/44* (2015.01); *E05F 15/46* (2015.01);
(Continued)

(58) Field of Classification Search
CPC .......... G01V 3/02; G01R 27/02; G01R 27/14; G01L 1/205; G01L 1/225; G01G 19/4142; E05F 15/44; E05F 15/46; E05F 15/443; B60R 21/015; E05Y 2900/55; G08B 13/08; H01H 3/142; B60J 10/00; B60J 5/0493; G01D 5/16; G01D 11/30
USPC .................. 324/705, 691, 649, 600; 73/849, 73/862.381, 862.391, 862.46, 862.471, 73/862.621, 862.68; 200/61.4, 61.41, 200/61.42, 61.43, 61.44, 61.71, 61.73, 511; 49/26, 27, 28
See application file for complete search history.

(56) References Cited

U.S. PATENT DOCUMENTS 3,652,911 A    3/1972  Gorissen
3,724,526 A    4/1973  Huprich
(Continued)

FOREIGN PATENT DOCUMENTS

DE    1460111 A1    12/1968
DE    1660717 A1     3/1971
(Continued)

*Primary Examiner* — Hoai-An D Nguyen
(74) *Attorney, Agent, or Firm* — Millman IP Inc.

(57) ABSTRACT

In an aspect, a pinch sensor is provided, comprising: an elongate non-conductive casing enclosing first, second, and third elongate conductive electrodes; the first and second electrodes being separated by a portion of the casing, a capacitance between the first and second electrodes changing when an obstacle approaches the first electrode to provide a proximity indication of the obstacle to the pinch sensor; and, the second and third electrodes being separated by an air gap formed in the casing, a resistance between the second and third electrodes changing when the second and third electrodes come into contact upon compression of the casing by the obstacle to provide a contact indication of the obstacle with the pinch sensor.

5 Claims, 29 Drawing Sheets

(51) Int. Cl.

| | | |
|---|---|---|
| *G01R 27/08* | (2006.01) | |
| *G01L 1/00* | (2006.01) | |
| *G01L 5/04* | (2006.01) | |
| *G01V 3/02* | (2006.01) | |
| *G01R 27/02* | (2006.01) | |
| *E05F 15/44* | (2015.01) | |
| *E05F 15/46* | (2015.01) | |
| *B60J 5/04* | (2006.01) | |
| *G01L 1/22* | (2006.01) | |
| *G01L 1/20* | (2006.01) | |
| *G01R 27/14* | (2006.01) | |

(52) U.S. Cl.
CPC ............. *G01D 11/30* (2013.01); *G01R 27/02* (2013.01); *G01V 3/02* (2013.01); *G01L 1/205* (2013.01); *G01L 1/225* (2013.01); *G01R 27/14* (2013.01)

(56) References Cited

U.S. PATENT DOCUMENTS

| | | |
|---|---|---|
| 3,727,348 A | 4/1973 | Steinmann et al. |
| 3,762,099 A | 10/1973 | Chaisson |
| 3,797,171 A | 3/1974 | Farmer |
| 3,919,809 A | 11/1975 | Haughton |
| 3,936,977 A | 2/1976 | Runft et al. |
| 4,045,631 A | 8/1977 | Dann |
| 4,157,845 A | 6/1979 | Queveau |
| 4,171,410 A | 10/1979 | Frob |
| 4,351,016 A | 9/1982 | Felbinger |
| 4,443,972 A | 4/1984 | Dolhaine |
| 4,453,112 A | 6/1984 | Sauer et al. |
| 4,506,378 A | 3/1985 | Noso et al. |
| 4,557,072 A | 12/1985 | Rittmeister et al. |
| 4,625,456 A | 12/1986 | Lafontaine |
| 4,683,975 A | 8/1987 | Booth et al. |
| 4,746,845 A | 5/1988 | Mizuta et al. |
| 4,773,155 A | 9/1988 | Buchien |
| 4,783,048 A | 11/1988 | St. Clair |
| 4,843,761 A | 7/1989 | Sandling |
| 4,920,698 A | 5/1990 | Friese et al. |
| 4,998,577 A | 3/1991 | Kobayashi et al. |
| 5,056,847 A | 10/1991 | Stillwell et al. |
| 5,072,080 A | 12/1991 | Beckhausen |
| 5,072,544 A | 12/1991 | Breck, Jr. |
| 5,105,131 A | 4/1992 | Schap |
| 5,129,192 A | 7/1992 | Hannush |
| 5,158,340 A | 10/1992 | Boda |
| 5,167,432 A | 12/1992 | Buttner et al. |
| 5,299,386 A | 4/1994 | Naegelli et al. |
| 5,333,411 A | 8/1994 | Tschirschwitz et al. |
| 5,459,962 A | 10/1995 | Bonne et al. |
| 5,512,716 A | 4/1996 | Buchien |
| 5,515,649 A | 5/1996 | Strab |
| 5,530,329 A | 6/1996 | Shigematsu et al. |
| 5,575,372 A | 11/1996 | Huebner et al. |
| 5,594,316 A | 1/1997 | Hayashida |
| 5,605,429 A | 2/1997 | Hejazi et al. |
| 5,610,484 A | 3/1997 | Georgin |
| 5,644,869 A | 7/1997 | Buchanan, Jr. |
| 5,653,144 A | 8/1997 | Fenelon |
| 5,661,385 A | 8/1997 | McEwan |
| 5,689,160 A | 11/1997 | Shigematsu et al. |
| 5,689,250 A | 11/1997 | Kremser |
| 5,693,993 A | 12/1997 | Ito et al. |
| 5,711,111 A | 1/1998 | Nyffenegger et al. |
| 5,728,983 A | 3/1998 | Ishihara et al. |
| 5,787,636 A | 8/1998 | Buchanan, Jr. |
| 5,801,340 A | 9/1998 | Peter |
| 5,801,501 A | 9/1998 | Redelberger |
| 5,816,309 A | 10/1998 | Paradise |
| 5,857,510 A | 1/1999 | Krupke et al. |
| 5,880,421 A | 3/1999 | Tsuge et al. |
| 5,920,521 A | 7/1999 | Kromer et al. |
| 5,929,406 A | 7/1999 | Thiel |
| 5,932,931 A | 8/1999 | Tanaka et al. |
| 5,949,207 A | 9/1999 | Luebke et al. |
| 5,955,854 A | 9/1999 | Zhang et al. |
| 5,982,126 A | 11/1999 | Hellinga et al. |
| 6,032,415 A | 3/2000 | Tajima |
| 6,034,495 A | 3/2000 | Tamagawa et al. |
| 6,034,497 A | 3/2000 | Tamagawa et al. |
| 6,037,727 A | 3/2000 | Kawanobe et al. |
| 6,051,901 A | 4/2000 | Ishida |
| 6,051,945 A | 4/2000 | Furukawa |
| 6,082,499 A | 7/2000 | O'Donnell |
| 6,088,965 A | 7/2000 | Fukumoto et al. |
| 6,097,299 A | 8/2000 | Yamamura |
| 6,107,712 A | 8/2000 | Yamamura et al. |
| 6,114,820 A | 9/2000 | Nishigaya |
| 6,125,583 A | 10/2000 | Murray et al. |
| 6,134,836 A | 10/2000 | Kawanobe et al. |
| 6,134,837 A | 10/2000 | Kawanobe et al. |
| 6,141,908 A | 11/2000 | Bowen |
| 6,145,918 A | 11/2000 | Wilbanks, II |
| 6,150,781 A | 11/2000 | Hollerbach |
| 6,160,370 A | 12/2000 | Ohnuma |
| 6,163,080 A | 12/2000 | Castellon |
| 6,164,015 A | 12/2000 | Kawanobe et al. |
| 6,169,346 B1 | 1/2001 | Nakamura et al. |
| 6,169,379 B1 | 1/2001 | Zhang et al. |
| 6,183,040 B1 | 2/2001 | Imaizumi et al. |
| 6,189,265 B1 | 2/2001 | Fink |
| 6,194,855 B1 | 2/2001 | Lochmahr et al. |
| 6,199,322 B1 | 3/2001 | Itami et al. |
| 6,199,943 B1 | 3/2001 | Lamm et al. |
| 6,209,264 B1 | 4/2001 | D'Abreu |
| 6,220,026 B1 | 4/2001 | Ritter |
| 6,223,468 B1 | 5/2001 | Kobayashi |
| 6,226,925 B1 | 5/2001 | Shimura et al. |
| 6,233,872 B1 | 5/2001 | Glagow et al. |
| 6,271,512 B1 | 8/2001 | Lewis |
| 6,274,947 B1 | 8/2001 | Terashima |
| 6,283,543 B1 | 9/2001 | Hahn et al. |
| 6,290,283 B1 | 9/2001 | Fukumoto et al. |
| 6,291,957 B1 | 9/2001 | Hopson et al. |
| 6,297,605 B1 | 10/2001 | Butler et al. |
| 6,297,609 B1 | 10/2001 | Takahashi et al. |
| 6,304,178 B1 | 10/2001 | Hayashida |
| 6,340,199 B1 | 1/2002 | Fukumoto et al. |
| 6,341,448 B1 | 1/2002 | Murray et al. |
| 6,366,042 B1 | 4/2002 | Gerbetz |
| 6,377,009 B1 | 4/2002 | Philipp |
| 6,382,701 B1 | 5/2002 | Langguth et al. |
| 6,386,620 B1 | 5/2002 | Fukumoto et al. |
| 6,404,084 B1 | 6/2002 | Niki et al. |
| 6,405,485 B1 | 6/2002 | Itami et al. |
| 6,425,206 B1 | 7/2002 | Noda et al. |
| 6,426,604 B1 | 7/2002 | Ito et al. |
| 6,430,872 B1 | 8/2002 | Fin |
| 6,456,916 B1 | 9/2002 | Edgar et al. |
| 6,472,835 B2 | 10/2002 | Ogasawara |
| 6,472,984 B1 | 10/2002 | Risi |
| 6,483,054 B2 | 11/2002 | Suzuki et al. |
| 6,502,352 B1 | 1/2003 | Bonduel |
| 6,504,332 B1 | 1/2003 | Lamm |
| 6,531,840 B2 | 3/2003 | Sugawara |
| 6,534,939 B2 | 3/2003 | Kato et al. |
| 6,550,597 B2 | 4/2003 | Taniguchi |
| 6,552,506 B2 | 4/2003 | Kramer et al. |
| 6,555,978 B1 | 4/2003 | Castellon |
| 6,573,676 B1 | 6/2003 | Klesing |
| 6,573,677 B2 | 6/2003 | Gerbetz |
| 6,573,678 B2 | 6/2003 | Losey et al. |
| 6,575,864 B1 | 6/2003 | Dean |
| 6,580,240 B2 | 6/2003 | Buchheit et al. |
| 6,580,241 B1 | 6/2003 | Sugawara |
| 6,588,151 B1 | 7/2003 | Gosicki et al. |
| 6,592,178 B2 | 7/2003 | Schober et al. |
| 6,600,284 B1 | 7/2003 | Weber et al. |
| 6,605,910 B2 | 8/2003 | Mullet et al. |
| 6,609,432 B2 | 8/2003 | Kume |
| 6,630,808 B1 | 10/2003 | Kliffken et al. |

(56) References Cited

U.S. PATENT DOCUMENTS

| | | |
|---|---|---|
| 6,633,147 B2 | 10/2003 | Gerbetz |
| 6,633,148 B1 | 10/2003 | Klesing |
| 6,660,200 B2 | 12/2003 | Nakajo |
| 6,660,955 B1 | 12/2003 | Bues |
| 6,667,591 B2 | 12/2003 | Mullet et al. |
| 6,670,654 B2 | 12/2003 | Lanzerotti et al. |
| 6,672,362 B1 | 1/2004 | Mullet et al. |
| 6,678,601 B2 | 1/2004 | Whinnery |
| 6,689,970 B2 | 2/2004 | Burgess et al. |
| 6,690,096 B2 | 2/2004 | Sasaki |
| 6,701,779 B2 | 3/2004 | Volant et al. |
| 6,703,933 B2 | 3/2004 | Sicuranza |
| 6,706,978 B2 | 3/2004 | Wagatsuma et al. |
| 6,717,081 B2 | 4/2004 | Miyake |
| 6,719,356 B2 | 4/2004 | Cleland et al. |
| 6,724,324 B1 | 4/2004 | Lambert |
| 6,729,071 B1 | 5/2004 | Kawanobe et al. |
| 6,731,483 B2 | 5/2004 | Mason, Jr. et al. |
| 6,740,826 B1 | 5/2004 | Friedrich et al. |
| 6,744,365 B2 | 6/2004 | Sicuranza |
| 6,747,233 B1 | 6/2004 | Glinkowski |
| 6,748,308 B2 | 6/2004 | Losey |
| 6,752,330 B2 | 6/2004 | DiMaggio et al. |
| 6,753,669 B2 | 6/2004 | Spreng et al. |
| 6,756,754 B2 | 6/2004 | Bent et al. |
| 6,759,614 B2 | 7/2004 | Yoneyama |
| 6,769,358 B2 | 8/2004 | Jordan |
| 6,769,938 B2 | 8/2004 | Eckert et al. |
| 6,771,159 B2 | 8/2004 | Ramahi et al. |
| 6,772,559 B1 | 8/2004 | Bouamra et al. |
| 6,788,016 B2 | 9/2004 | Whinnery |
| 6,794,771 B2 | 9/2004 | Orloff |
| 6,794,837 B1 | 9/2004 | Whinnery et al. |
| 6,798,029 B2 | 9/2004 | Volant et al. |
| 6,802,154 B1 | 10/2004 | Holt et al. |
| 6,809,440 B2 | 10/2004 | Peterreins |
| 6,809,488 B2 | 10/2004 | Otte |
| 6,812,466 B2 | 11/2004 | O'Connor et al. |
| 6,822,410 B2 | 11/2004 | Whinnery et al. |
| 6,830,173 B2 | 12/2004 | Barber et al. |
| 6,831,380 B2 | 12/2004 | Rybnicek et al. |
| 6,833,713 B2 | 12/2004 | Schoepf et al. |
| 6,836,209 B2 | 12/2004 | Ploucha |
| 6,842,098 B2 | 1/2005 | Van Zeeland |
| 6,846,999 B2 | 1/2005 | Kawakami et al. |
| 6,850,145 B1 | 2/2005 | Kremers et al. |
| 6,855,902 B2 | 2/2005 | Lee et al. |
| 6,856,112 B2 | 2/2005 | Ohshima |
| 6,859,030 B2 | 2/2005 | Otte |
| 6,867,563 B2 | 3/2005 | Ohshima |
| 6,873,127 B2 | 3/2005 | Murray |
| 6,883,382 B2 | 4/2005 | Ogino et al. |
| 6,889,578 B2 | 5/2005 | Spaziani et al. |
| 6,896,268 B2 | 5/2005 | Hofmann et al. |
| 6,898,295 B2 | 5/2005 | Inamura et al. |
| 6,903,288 B2 | 6/2005 | Varga |
| 6,906,514 B2 | 6/2005 | Ausserlechner |
| 6,906,527 B1 | 6/2005 | Niimi et al. |
| 6,917,002 B2 | 7/2005 | Burgess et al. |
| 6,922,006 B2 | 7/2005 | Nomerange |
| 6,924,538 B2 | 8/2005 | Jaiprakash et al. |
| 6,924,614 B2 | 8/2005 | Onozawa et al. |
| 6,930,577 B2 | 8/2005 | Subramanian et al. |
| 6,936,984 B2 | 8/2005 | Wilson |
| 6,936,986 B2 | 8/2005 | Nuber |
| 6,936,988 B2 | 8/2005 | Nakazawa et al. |
| 6,940,028 B2 | 9/2005 | Eggers |
| 6,940,246 B2 | 9/2005 | Mochizuki et al. |
| 6,943,310 B2 | 9/2005 | Eisenhower |
| 6,946,608 B2 | 9/2005 | Brede et al. |
| 6,952,087 B2 | 10/2005 | Lamm |
| 6,955,206 B2 | 10/2005 | Mullet et al. |
| 6,962,228 B2 | 11/2005 | Ogino et al. |
| 6,963,029 B1 | 11/2005 | Rivers et al. |
| 6,963,267 B2 | 11/2005 | Murray |
| 6,964,132 B2 | 11/2005 | Otomo et al. |
| 6,966,149 B2 | 11/2005 | Fenelon |
| 6,967,451 B2 | 11/2005 | Miyauchi |
| 6,968,746 B2 | 11/2005 | Shank et al. |
| 6,972,536 B2 | 12/2005 | Mukai et al. |
| 6,975,047 B2 | 12/2005 | Pippin |
| 6,990,009 B2 | 1/2006 | Bertin et al. |
| 7,000,352 B2 | 2/2006 | Ishihara et al. |
| 7,009,153 B2 | 3/2006 | Tomatsu |
| 7,009,352 B2 | 3/2006 | Yamamoto et al. |
| 7,012,491 B1 | 3/2006 | Geisberger et al. |
| 7,015,409 B2 | 3/2006 | Duffek et al. |
| 7,015,666 B2 | 3/2006 | Staus |
| 7,021,001 B1 | 4/2006 | Schooler et al. |
| 7,023,307 B2 | 4/2006 | Dooley |
| 7,026,930 B2 | 4/2006 | Appel et al. |
| 7,038,154 B2 | 5/2006 | Hofte et al. |
| 7,038,414 B2 | 5/2006 | Daniels et al. |
| 7,038,896 B2 | 5/2006 | Sullivan et al. |
| 7,044,271 B2 | 5/2006 | De Coi |
| 7,046,129 B2 | 5/2006 | Regnet et al. |
| 7,049,535 B2 | 5/2006 | Matsuyama et al. |
| 7,050,897 B2 | 5/2006 | Breed et al. |
| 7,056,033 B2 | 6/2006 | Castellon |
| 7,067,794 B2 | 6/2006 | Le Gallo et al. |
| 7,070,226 B2 | 7/2006 | Cleland et al. |
| 7,071,023 B2 | 7/2006 | Bertin et al. |
| 7,073,291 B2 | 7/2006 | Kawanobe et al. |
| 7,075,256 B2 | 7/2006 | Murray |
| 7,086,687 B2 | 8/2006 | Aoki et al. |
| 7,095,200 B2 | 8/2006 | Shinohara et al. |
| 7,099,136 B2 | 8/2006 | Seale et al. |
| 7,102,089 B2 | 9/2006 | Burgess et al. |
| 7,104,589 B2 | 9/2006 | Takeda et al. |
| 7,109,677 B1 | 9/2006 | Gagnon et al. |
| 7,115,823 B1 | 10/2006 | Anaya-Burgos |
| 7,123,487 B2 | 10/2006 | Saito et al. |
| 7,132,642 B2 | 11/2006 | Shank et al. |
| 7,135,946 B2 | 11/2006 | Hoffmann |
| 7,137,541 B2 | 11/2006 | Baskar et al. |
| 7,138,595 B2 | 11/2006 | Berry et al. |
| 7,138,669 B2 | 11/2006 | Lanzerotti et al. |
| 7,139,158 B2 | 11/2006 | Niayesh et al. |
| 7,140,151 B2 | 11/2006 | Spaziani et al. |
| 7,143,548 B2 | 12/2006 | Kleinmann et al. |
| 7,144,068 B2 | 12/2006 | Oxley et al. |
| 7,145,761 B2 | 12/2006 | Shimizu et al. |
| 7,151,220 B1 | 12/2006 | Rubin de la Borbolla |
| 7,151,331 B2 | 12/2006 | Niayesh et al. |
| 7,152,695 B2 | 12/2006 | Happ et al. |
| 7,161,106 B2 | 1/2007 | Kohatsu et al. |
| 7,161,787 B2 | 1/2007 | Joens |
| 7,165,457 B2 | 1/2007 | Ogino et al. |
| 7,173,514 B2 | 2/2007 | Mullet et al. |
| 7,174,674 B2 | 2/2007 | Hattori et al. |
| 7,179,995 B2 | 2/2007 | Dinh |
| 7,183,508 B2 | 2/2007 | Kasai |
| 7,183,672 B2 | 2/2007 | Lewis |
| 7,186,270 B2 | 3/2007 | Elkins |
| 7,187,146 B2 | 3/2007 | Saito et al. |
| 7,202,674 B2 | 4/2007 | Nakano et al. |
| 7,202,764 B2 | 4/2007 | Deligianni et al. |
| 7,205,734 B2 | 4/2007 | Kidokoro |
| 7,208,680 B2 | 4/2007 | Drane |
| 7,211,975 B2 | 5/2007 | Murray et al. |
| 7,224,136 B2 | 5/2007 | Saitou et al. |
| 7,226,112 B2 | 6/2007 | Ward |
| 7,227,447 B2 | 6/2007 | Ohtaki et al. |
| 7,228,883 B1 | 6/2007 | Murray |
| 7,230,354 B2 | 6/2007 | Lewis |
| 7,243,461 B2 | 7/2007 | Rogers, Jr. et al. |
| 7,244,148 B2 | 7/2007 | Maguire et al. |
| 7,244,213 B2 | 7/2007 | Gueler et al. |
| 7,250,571 B2 | 7/2007 | Magno |
| 7,250,736 B2 | 7/2007 | Hirai |
| 7,259,410 B2 | 8/2007 | Jaiprakash et al. |
| 7,265,311 B1 | 9/2007 | Schaltenbrand et al. |
| 7,269,924 B2 | 9/2007 | Otomo et al. |
| 7,282,656 B2 | 10/2007 | Niiyama |

(56) References Cited

U.S. PATENT DOCUMENTS

| | | |
|---|---|---|
| 7,283,023 B2 | 10/2007 | Robert |
| 7,285,877 B2 | 10/2007 | Gorti et al. |
| 7,289,014 B2 | 10/2007 | Mullet et al. |
| 7,289,310 B1 | 10/2007 | Yuan |
| 7,301,099 B1 | 11/2007 | Korcz |
| 7,305,290 B2 | 12/2007 | Russ et al. |
| 7,307,395 B2 | 12/2007 | Bouamra et al. |
| 7,309,971 B2 | 12/2007 | Honma et al. |
| 7,312,414 B2 | 12/2007 | Yatsu et al. |
| 7,315,228 B2 | 1/2008 | Dooley |
| 7,319,301 B2 | 1/2008 | Pribisic |
| 7,323,638 B1 | 1/2008 | Radosavljevic |
| 7,329,822 B1 | 2/2008 | Orrico |
| 7,339,401 B2 | 3/2008 | Bertin et al. |
| 7,342,190 B2 | 3/2008 | Burgess et al. |
| 7,345,252 B2 | 3/2008 | Takenaka et al. |
| 7,359,783 B2 | 4/2008 | Vives et al. |
| 7,360,635 B2 | 4/2008 | Rhodes et al. |
| 7,362,068 B2 | 4/2008 | Yamamoto |
| 7,365,279 B2 | 4/2008 | Beerling |
| 7,365,622 B2 | 4/2008 | Kajan et al. |
| 7,375,299 B1 | 5/2008 | Pudney |
| 7,381,913 B2 | 6/2008 | Sjostrom |
| 7,385,154 B2 | 6/2008 | Klug |
| 7,426,803 B2 | 9/2008 | Fronz et al. |
| 7,439,636 B2 | 10/2008 | Lewis |
| 7,462,792 B1 | 12/2008 | Hellmers et al. |
| 7,488,906 B2 | 2/2009 | Taguchi et al. |
| 7,498,923 B2 | 3/2009 | Iversen |
| 7,499,254 B2 | 3/2009 | Joens |
| 7,514,641 B2 | 4/2009 | Kohatsu et al. |
| 7,530,850 B2 | 5/2009 | Maguire et al. |
| 7,531,743 B2 | 5/2009 | Johnson et al. |
| 7,535,327 B2 | 5/2009 | Desilva et al. |
| 7,541,759 B2 | 6/2009 | Hirai |
| 7,542,334 B2 | 6/2009 | Bertin et al. |
| 7,548,809 B2 | 6/2009 | Westerhoff |
| 7,570,001 B2 | 8/2009 | Noro et al. |
| 7,581,314 B2 | 9/2009 | Deligianni et al. |
| 7,583,508 B2 | 9/2009 | Hagiwara et al. |
| 7,588,960 B2 | 9/2009 | Bertin et al. |
| 7,605,554 B2 | 10/2009 | Kunkel |
| 2001/0013200 A1 | 8/2001 | Fink |
| 2001/0017587 A1 | 8/2001 | Suzuki et al. |
| 2001/0024063 A1 | 9/2001 | Sasaki |
| 2001/0027146 A1 | 10/2001 | Spaziani et al. |
| 2001/0030520 A1 | 10/2001 | Losey et al. |
| 2001/0042820 A1 | 11/2001 | Wilson |
| 2001/0048280 A1 | 12/2001 | Wilson |
| 2002/0014871 A1 | 2/2002 | Sugawara |
| 2002/0024308 A1 | 2/2002 | Kato et al. |
| 2002/0039008 A1 | 4/2002 | Edgar et al. |
| 2002/0040266 A1 | 4/2002 | Edgar et al. |
| 2002/0043948 A1 | 4/2002 | Ogasawara |
| 2002/0046815 A1 | 4/2002 | Taniguchi |
| 2002/0047678 A1 | 4/2002 | Wilson |
| 2002/0088283 A1 | 7/2002 | Kume |
| 2002/0093420 A1 | 7/2002 | Sicuranza |
| 2002/0101098 A1 | 8/2002 | Schober et al. |
| 2002/0113602 A1 | 8/2002 | Ishihara et al. |
| 2002/0117985 A1 | 8/2002 | Buchheit et al. |
| 2002/0143452 A1 | 10/2002 | Losey |
| 2002/0152684 A1 | 10/2002 | Fink |
| 2002/0154012 A1 | 10/2002 | Risi |
| 2002/0180269 A1 | 12/2002 | Dalakuras et al. |
| 2002/0189168 A1 | 12/2002 | Sicuranza |
| 2002/0190677 A1 | 12/2002 | Gerbetz |
| 2002/0190679 A1 | 12/2002 | Lamm |
| 2002/0190680 A1 | 12/2002 | Gerbetz |
| 2003/0006728 A1 | 1/2003 | Spreng et al. |
| 2003/0011336 A1 | 1/2003 | Kramer et al. |
| 2003/0030299 A1 | 2/2003 | Cleland et al. |
| 2003/0062865 A1 | 4/2003 | Mullet et al. |
| 2003/0076062 A1 | 4/2003 | Mullet et al. |
| 2003/0085679 A1 | 5/2003 | Bledin et al. |
| 2003/0111995 A1 | 6/2003 | Otte |
| 2003/0111996 A1 | 6/2003 | Otte |
| 2003/0115801 A1 | 6/2003 | Gosicki et al. |
| 2003/0140565 A1 | 7/2003 | Otomo et al. |
| 2003/0151382 A1 | 8/2003 | Daniels et al. |
| 2003/0174044 A1 | 9/2003 | Murray |
| 2003/0210005 A1 | 11/2003 | Murray |
| 2003/0222610 A1 | 12/2003 | Whinnery |
| 2003/0222614 A1 | 12/2003 | Whinnery et al. |
| 2003/0225497 A1 | 12/2003 | Whinnery |
| 2003/0233183 A1 | 12/2003 | Nuber |
| 2003/0234543 A1 | 12/2003 | Onozawa et al. |
| 2004/0040771 A1 | 3/2004 | Ploucha |
| 2004/0056199 A1 | 3/2004 | O'Connor et al. |
| 2004/0061462 A1 | 4/2004 | Bent et al. |
| 2004/0070316 A1 | 4/2004 | Neubauer et al. |
| 2004/0079867 A1 | 4/2004 | Le Gallo et al. |
| 2004/0090203 A1 | 5/2004 | Appel et al. |
| 2004/0099382 A1 | 5/2004 | Mullet et al. |
| 2004/0104701 A1 | 6/2004 | Ohshima |
| 2004/0108171 A1 | 6/2004 | De Coi |
| 2004/0111970 A1 | 6/2004 | Fenelon |
| 2004/0112139 A1 | 6/2004 | Ogino et al. |
| 2004/0112662 A1 | 6/2004 | Ogino et al. |
| 2004/0116499 A1 | 6/2004 | Mayser et al. |
| 2004/0124662 A1 | 7/2004 | Cleland et al. |
| 2004/0124972 A1 | 7/2004 | Strzelczyk |
| 2004/0130285 A1 | 7/2004 | Le Gallo |
| 2004/0134129 A1 | 7/2004 | Hattori et al. |
| 2004/0136659 A1 | 7/2004 | Castellon |
| 2004/0138843 A1 | 7/2004 | Bouamra et al. |
| 2004/0139656 A1 | 7/2004 | Takeda et al. |
| 2004/0164693 A1 | 8/2004 | Murray et al. |
| 2004/0172879 A1 | 9/2004 | Regnet et al. |
| 2004/0187391 A1 | 9/2004 | Fenelon |
| 2004/0189046 A1 | 9/2004 | Kawanobe et al. |
| 2004/0215382 A1 | 10/2004 | Breed et al. |
| 2004/0216383 A1 | 11/2004 | Rogers, Jr. et al. |
| 2004/0222759 A1 | 11/2004 | Ohshima |
| 2004/0236478 A1 | 11/2004 | Le Gallo et al. |
| 2004/0261317 A1 | 12/2004 | Murray |
| 2005/0012482 A1 | 1/2005 | Kidokoro |
| 2005/0012484 A1 | 1/2005 | Gifford et al. |
| 2005/0016290 A1 | 1/2005 | Shank et al. |
| 2005/0017460 A1 | 1/2005 | Hofmann et al. |
| 2005/0017600 A1 | 1/2005 | Nomerange |
| 2005/0017667 A1 | 1/2005 | Yamamoto |
| 2005/0030153 A1 | 2/2005 | Mullet et al. |
| 2005/0043872 A1 | 2/2005 | Heyn |
| 2005/0046584 A1 | 3/2005 | Breed |
| 2005/0067987 A1 | 3/2005 | Nakazawa et al. |
| 2005/0072049 A1 | 4/2005 | Spaziani et al. |
| 2005/0073852 A1 | 4/2005 | Ward |
| 2005/0083003 A1 | 4/2005 | Mochizuki et al. |
| 2005/0083004 A1 | 4/2005 | Yamamoto et al. |
| 2005/0092097 A1 | 5/2005 | Shank et al. |
| 2005/0103117 A1 | 5/2005 | Ogino et al. |
| 2005/0110300 A1 | 5/2005 | Oxley et al. |
| 2005/0117270 A1 | 6/2005 | Scherraus |
| 2005/0134426 A1 | 6/2005 | Mullet et al. |
| 2005/0146298 A1 | 7/2005 | Murray |
| 2005/0151495 A1 | 7/2005 | Miyauchi |
| 2005/0160673 A1 | 7/2005 | Kleinmann et al. |
| 2005/0160675 A1 | 7/2005 | Fenelon |
| 2005/0168010 A1 | 8/2005 | Cleland et al. |
| 2005/0177977 A1 | 8/2005 | Hattori et al. |
| 2005/0179409 A1 | 8/2005 | Honma et al. |
| 2005/0179445 A1 | 8/2005 | Nakano et al. |
| 2005/0187688 A1 | 8/2005 | Bigorra Vives et al. |
| 2005/0187689 A1 | 8/2005 | Westerhoff |
| 2005/0203690 A1 | 9/2005 | Russ et al. |
| 2005/0235564 A1 | 10/2005 | Fronz et al. |
| 2005/0246054 A1 | 11/2005 | Fink |
| 2005/0264033 A1 | 12/2005 | Aoki et al. |
| 2005/0269038 A1 | 12/2005 | Murakami et al. |
| 2005/0275363 A1 | 12/2005 | Honma et al. |
| 2005/0276449 A1 | 12/2005 | Pedemas et al. |
| 2005/0277512 A1 | 12/2005 | Gueler et al. |
| 2006/0006823 A1 | 1/2006 | Ferretti |

(56) References Cited

U.S. PATENT DOCUMENTS

| | | |
|---|---|---|
| 2006/0022618 A1 | 2/2006 | Rhodes et al. |
| 2006/0028159 A1 | 2/2006 | Otomo et al. |
| 2006/0090400 A1 | 5/2006 | Los et al. |
| 2006/0131915 A1 | 6/2006 | Ogino et al. |
| 2006/0151231 A1 | 7/2006 | Bucksch et al. |
| 2006/0178795 A1 | 8/2006 | Queveau et al. |
| 2006/0282204 A1 | 12/2006 | Breed |
| 2006/0288642 A1 | 12/2006 | Marentette |
| 2007/0084120 A1 | 4/2007 | Kobayashi et al. |
| 2007/0125000 A1 | 6/2007 | Fenelon |
| 2007/0183182 A1 | 8/2007 | Pribisic |
| 2008/0052996 A1 | 3/2008 | Sugiura |
| 2008/0065296 A1 | 3/2008 | Stolz |
| 2008/0136358 A1 | 6/2008 | Newman et al. |
| 2008/0190028 A1 | 8/2008 | Oxley |
| 2008/0204047 A1 | 8/2008 | Wern et al. |
| 2008/0229667 A1 | 9/2008 | Dufour et al. |
| 2008/0244984 A1 | 10/2008 | Kelly |
| 2008/0295408 A1 | 12/2008 | Heissler |
| 2008/0296927 A1 | 12/2008 | Gisler et al. |
| 2008/0297076 A1 | 12/2008 | Sakai et al. |
| 2008/0302014 A1 | 12/2008 | Szczerba et al. |
| 2009/0000198 A1 | 1/2009 | Brown |
| 2009/0000424 A1 | 1/2009 | Taubmann et al. |
| 2009/0058347 A1 | 3/2009 | Whinnery |
| 2009/0100755 A1 | 4/2009 | Ishihara |
| 2009/0100758 A1 | 4/2009 | Nagakura |
| 2009/0107050 A1 | 4/2009 | Suzuki |
| 2009/0139142 A1 | 6/2009 | Li |
| 2009/0173006 A1 | 7/2009 | Jitsuishi et al. |
| 2009/0206784 A1 | 8/2009 | Inoue et al. |
| 2009/0211156 A1 | 8/2009 | Appel |
| 2009/0217596 A1 | 9/2009 | Neundorf et al. |
| 2009/0222174 A1 | 9/2009 | Frommer et al. |
| 2009/0229183 A1 | 9/2009 | Kamiya |
| 2009/0260289 A1 | 10/2009 | Carpenter et al. |
| 2009/0265989 A1 | 10/2009 | Mueller et al. |
| 2009/0272035 A1 | 11/2009 | Boisvert et al. |

FOREIGN PATENT DOCUMENTS

| | | |
|---|---|---|
| DE | 1660737 A1 | 4/1971 |
| DE | 1660738 A1 | 8/1971 |
| DE | 2729738 A1 | 4/1979 |
| DE | 7936058 U1 | 4/1980 |
| DE | 8011510 U1 | 7/1980 |
| DE | 8104702 U1 | 11/1981 |
| DE | 3130473 A1 | 2/1983 |
| DE | 8433857 U1 | 4/1985 |
| DE | 3507922 A1 | 9/1986 |
| DE | 4002026 A1 | 9/1990 |
| DE | 3915931 A1 | 11/1990 |
| DE | 9014432 U1 | 1/1991 |
| DE | 3930644 A1 | 3/1991 |
| DE | 9306553 U1 | 8/1993 |
| DE | 9311354 U1 | 9/1993 |
| DE | 4240622 A1 | 6/1994 |
| DE | 9403972 U1 | 7/1994 |
| DE | 9407645 U1 | 7/1994 |
| DE | 9311632 U1 | 9/1994 |
| DE | 9414962 U1 | 11/1994 |
| DE | 4321139 A1 | 1/1995 |
| DE | 4328167 A1 | 3/1995 |
| DE | 9415040 U1 | 10/1995 |
| DE | 4422698 A1 | 1/1996 |
| DE | 4443957 A1 | 3/1996 |
| DE | 19529079 A1 | 2/1997 |
| DE | 19531550 A1 | 3/1997 |
| DE | 19538071 A1 | 4/1997 |
| DE | 19538073 A1 | 4/1997 |
| DE | 9321338 U1 | 6/1997 |
| DE | 19546504 A1 | 6/1997 |
| DE | 19602744 A1 | 7/1997 |
| DE | 19604128 C1 | 8/1997 |
| DE | 19615548 A1 | 10/1997 |
| DE | 19629671 A1 | 1/1998 |
| DE | 19632592 C1 | 1/1998 |
| DE | 4329535 C2 | 3/1998 |
| DE | 19632590 C1 | 3/1998 |
| DE | 19632591 C1 | 3/1998 |
| DE | 19913106 C1 | 5/2000 |
| DE | 19913105 A1 | 10/2000 |
| DE | 19925050 A1 | 12/2000 |
| DE | 20013310 U1 | 12/2000 |
| DE | 20015330 U1 | 3/2001 |
| DE | 19948321 A1 | 4/2001 |
| DE | 10046974 A1 | 10/2001 |
| DE | 10046975 A1 | 5/2002 |
| DE | 10109005 A1 | 9/2002 |
| DE | 10109280 A1 | 9/2002 |
| DE | 10133644 A1 | 4/2003 |
| DE | 10140930 C1 | 6/2003 |
| DE | 20204796 U1 | 9/2003 |
| DE | 10221315 A1 | 11/2003 |
| DE | 10046975 B4 | 4/2004 |
| DE | 202004014861 U1 | 1/2005 |
| DE | 10310066 B3 | 2/2005 |
| DE | 10349650 A1 | 5/2005 |
| DE | 202005008450 U1 | 10/2005 |
| DE | 10220187 B4 | 11/2005 |
| DE | 20221517 U1 | 3/2006 |
| DE | 102004055476 B3 | 3/2006 |
| DE | 102004060328 A1 | 6/2006 |
| DE | 102005028739 B3 | 6/2006 |
| DE | 102005016252 B3 | 2/2007 |
| DE | 102006015687 A1 | 10/2007 |
| DE | 102004002415 B4 | 7/2008 |
| DE | 102008010074 B3 | 2/2009 |
| DE | 202008013508 U1 | 2/2009 |
| DE | 102007050352 A1 | 4/2009 |
| DE | 102008050897 A1 | 7/2009 |
| EP | 0259573 A1 | 3/1988 |
| EP | 0296134 A1 | 12/1988 |
| EP | 0215037 B1 | 8/1989 |
| EP | 0425628 B1 | 5/1990 |
| EP | 0408537 A1 | 1/1991 |
| EP | 0489610 A1 | 6/1992 |
| EP | 0326623 B1 | 3/1993 |
| EP | 0638701 A2 | 9/1993 |
| EP | 0625283 B1 | 11/1993 |
| EP | 0630588 A2 | 5/1994 |
| EP | 0615047 A1 | 9/1994 |
| EP | 0640740 A1 | 3/1995 |
| EP | 0562076 B1 | 6/1995 |
| EP | 0663981 B1 | 7/1995 |
| EP | 0730743 B1 | 9/1995 |
| EP | 0666956 B1 | 7/1997 |
| EP | 0782158 A2 | 7/1997 |
| EP | 0803628 A2 | 10/1997 |
| EP | 0812049 A1 | 12/1997 |
| EP | 0673464 B1 | 8/1998 |
| EP | 0901210 A3 | 9/1999 |
| EP | 0823957 B1 | 12/1999 |
| EP | 1017145 A2 | 7/2000 |
| EP | 1031696 A2 | 8/2000 |
| EP | 1081829 A1 | 3/2001 |
| EP | 1091062 A2 | 4/2001 |
| EP | 1096089 A2 | 5/2001 |
| EP | 1134631 A2 | 9/2001 |
| EP | 1186456 A2 | 9/2001 |
| EP | 1146191 A1 | 10/2001 |
| EP | 1167675 A1 | 1/2002 |
| EP | 1176687 A2 | 1/2002 |
| EP | 1180443 A1 | 2/2002 |
| EP | 1275313 A2 | 6/2002 |
| EP | 1286478 A1 | 6/2002 |
| EP | 1221705 A2 | 7/2002 |
| EP | 0842504 B1 | 8/2002 |
| EP | 1271739 A1 | 1/2003 |
| EP | 0910718 B1 | 3/2003 |
| EP | 1298275 A1 | 4/2003 |
| EP | 1304442 A2 | 4/2003 |
| EP | 1464786 A1 | 4/2003 |

(56) References Cited

FOREIGN PATENT DOCUMENTS

| | | | |
|---|---|---|---|
| EP | 1003950 | B1 | 5/2003 |
| EP | 1321324 | A1 | 6/2003 |
| EP | 1079983 | B1 | 2/2004 |
| EP | 0853714 | B1 | 3/2004 |
| EP | 1361095 | A3 | 3/2004 |
| EP | 1082513 | B1 | 4/2004 |
| EP | 1159504 | B1 | 5/2004 |
| EP | 1422090 | A1 | 5/2004 |
| EP | 0883724 | B1 | 6/2004 |
| EP | 1431094 | A1 | 6/2004 |
| EP | 1431095 | A1 | 6/2004 |
| EP | 1502817 | A1 | 7/2004 |
| EP | 1455044 | A2 | 9/2004 |
| EP | 1467461 | A1 | 10/2004 |
| EP | 1469332 | A1 | 10/2004 |
| EP | 1526241 | A1 | 10/2004 |
| EP | 1361096 | A3 | 11/2004 |
| EP | 1402639 | B1 | 11/2004 |
| EP | 1484466 | A2 | 12/2004 |
| EP | 0826095 | B1 | 1/2005 |
| EP | 1057673 | B1 | 1/2005 |
| EP | 1474582 | B1 | 4/2005 |
| EP | 1259692 | B1 | 8/2005 |
| EP | 1564357 | A2 | 8/2005 |
| EP | 1566510 | A2 | 8/2005 |
| EP | 1371803 | B1 | 9/2005 |
| EP | 1586732 | A2 | 10/2005 |
| EP | 1589177 | A1 | 10/2005 |
| EP | 1103009 | B1 | 12/2005 |
| EP | 1602518 | A2 | 12/2005 |
| EP | 1607562 | A1 | 12/2005 |
| EP | 1607564 | A1 | 12/2005 |
| EP | 1617030 | A2 | 1/2006 |
| EP | 1039084 | B1 | 2/2006 |
| EP | 1509824 | B1 | 2/2006 |
| EP | 1621712 | A1 | 2/2006 |
| EP | 1637682 | A1 | 3/2006 |
| EP | 1476627 | B1 | 5/2006 |
| EP | 1652710 | A2 | 5/2006 |
| EP | 1655436 | A2 | 5/2006 |
| EP | 0992410 | B1 | 6/2006 |
| EP | 1672151 | A2 | 6/2006 |
| EP | 1691015 | A1 | 8/2006 |
| EP | 1250507 | B1 | 10/2006 |
| EP | 1504167 | B1 | 10/2006 |
| EP | 1722339 | A1 | 11/2006 |
| EP | 1726761 | A1 | 11/2006 |
| EP | 1446544 | B1 | 9/2007 |
| EP | 1015723 | B1 | 10/2007 |
| EP | 1842998 | A2 | 10/2007 |
| EP | 1842999 | A2 | 10/2007 |
| EP | 1854677 | A1 | 11/2007 |
| EP | 1854953 | A2 | 11/2007 |
| EP | 1884616 | A1 | 2/2008 |
| EP | 1715127 | B1 | 3/2008 |
| EP | 1918493 | A2 | 5/2008 |
| EP | 1709276 | B1 | 6/2008 |
| EP | 1953569 | A1 | 8/2008 |
| EP | 1959321 | A2 | 8/2008 |
| EP | 2048014 | A2 | 9/2008 |
| EP | 1265767 | B1 | 10/2008 |
| EP | 1487653 | B1 | 10/2008 |
| EP | 1975361 | A2 | 10/2008 |
| EP | 1447511 | A3 | 12/2008 |
| EP | 1997996 | A1 | 12/2008 |
| EP | 2093365 | A2 | 1/2009 |
| EP | 1690713 | B1 | 2/2009 |
| EP | 2055881 | A2 | 5/2009 |
| EP | 2101023 | A2 | 9/2009 |
| JP | 6260054 | A | 9/1994 |
| JP | 2009090667 | A | 4/2009 |
| JP | 2009121054 | A2 | 6/2009 |
| JP | 2009161966 | A2 | 7/2009 |
| JP | 2009161967 | A2 | 7/2009 |
| JP | 2009161968 | | 7/2009 |
| JP | 2009167606 | A2 | 7/2009 |
| JP | 2009167632 | A2 | 7/2009 |
| WO | 84/00992 | A1 | 3/1984 |
| WO | 86/05317 | A1 | 9/1986 |
| WO | 90/14677 | A1 | 11/1990 |
| WO | 93/08356 | A1 | 4/1993 |
| WO | 94/08121 | A1 | 4/1994 |
| WO | 94/12996 | A1 | 6/1994 |
| WO | 94/22212 | A1 | 9/1994 |
| WO | 95/09959 | A1 | 4/1995 |
| WO | 95/25380 | A1 | 9/1995 |
| WO | 96/09559 | A1 | 3/1996 |
| WO | 96/35036 | A1 | 11/1996 |
| WO | 96/35037 | A1 | 11/1996 |
| WO | 96/41087 | A1 | 12/1996 |
| WO | 97/01835 | A1 | 1/1997 |
| WO | 97/06518 | A1 | 2/1997 |
| WO | 97/22775 | A1 | 6/1997 |
| WO | 97/22776 | A1 | 6/1997 |
| WO | 97/32102 | A1 | 9/1997 |
| WO | 97/40402 | A1 | 10/1997 |
| WO | 98/02631 | A1 | 1/1998 |
| WO | 98/26145 | A1 | 6/1998 |
| WO | 99/01637 | A1 | 1/1999 |
| WO | 99/09282 | A1 | 2/1999 |
| WO | 99/53345 | A1 | 10/1999 |
| WO | 99/53589 | A1 | 10/1999 |
| WO | 00/12421 | A1 | 3/2000 |
| WO | 00/53878 | A1 | 9/2000 |
| WO | 00/57013 | A1 | 9/2000 |
| WO | 00/58119 | A1 | 10/2000 |
| WO | 01/14676 | A1 | 3/2001 |
| WO | 01/29356 | A1 | 4/2001 |
| WO | 01/36772 | A1 | 5/2001 |
| WO | 01/56142 | A1 | 8/2001 |
| WO | 01/65044 | A1 | 9/2001 |
| WO | 01/66372 | A2 | 9/2001 |
| WO | 02/12699 | A1 | 2/2002 |
| WO | 02/27132 | A1 | 4/2002 |
| WO | 02/38905 | A2 | 5/2002 |
| WO | 02/068389 | A2 | 9/2002 |
| WO | 02/068424 | A1 | 9/2002 |
| WO | 02/073787 | A1 | 9/2002 |
| WO | 02/082613 | A1 | 10/2002 |
| WO | 02/087912 | A1 | 11/2002 |
| WO | 02/097947 | A2 | 12/2002 |
| WO | 02/101929 | A2 | 12/2002 |
| WO | 02/103874 | A2 | 12/2002 |
| WO | 03/016966 | A2 | 2/2003 |
| WO | 03/036774 | A1 | 5/2003 |
| WO | 03/038220 | A1 | 5/2003 |
| WO | 03/038221 | A1 | 5/2003 |
| WO | 03/063318 | A1 | 7/2003 |
| WO | 03/069104 | A1 | 8/2003 |
| WO | 03/074308 | A1 | 9/2003 |
| WO | 03/078776 | A2 | 9/2003 |
| WO | 03/095779 | A1 | 11/2003 |
| WO | 03/102338 | A2 | 12/2003 |
| WO | 03/102339 | A2 | 12/2003 |
| WO | 03/103349 | A2 | 12/2003 |
| WO | 2004/001438 | A2 | 12/2003 |
| WO | 2004/018817 | A2 | 3/2004 |
| WO | 2004/029565 | A2 | 4/2004 |
| WO | 2004/031520 | A1 | 4/2004 |
| WO | 01/53640 | A1 | 7/2004 |
| WO | 2004/054834 | A1 | 7/2004 |
| WO | 2004/054835 | A1 | 7/2004 |
| WO | 2004/063512 | A1 | 7/2004 |
| WO | 2004/022895 | A1 | 9/2004 |
| WO | 2004/084609 | A2 | 10/2004 |
| WO | 2004/088074 | A2 | 10/2004 |
| WO | 2004/090273 | A1 | 10/2004 |
| WO | 2005/059285 | A1 | 6/2005 |
| WO | 2005/066442 | A1 | 7/2005 |
| WO | 2005/080727 | A2 | 9/2005 |
| WO | 2005/098186 | A1 | 10/2005 |
| WO | 2005/116385 | A1 | 12/2005 |
| WO | 2006/001002 | A1 | 1/2006 |
| WO | 2006/031185 | A1 | 3/2006 |

(56) References Cited

FOREIGN PATENT DOCUMENTS

| | | |
|---|---|---|
| WO | 2006/031599 A1 | 3/2006 |
| WO | 2006/042236 A2 | 4/2006 |
| WO | 2006/066524 A1 | 6/2006 |
| WO | 2006/066535 A1 | 6/2006 |
| WO | 2006/086892 A1 | 8/2006 |
| WO | 2006/090161 A2 | 8/2006 |
| WO | 2006/106078 A2 | 10/2006 |
| WO | 2007/017014 A1 | 2/2007 |
| WO | 2007/022355 A2 | 2/2007 |
| WO | 2007/093910 A2 | 8/2007 |
| WO | 2007/093912 A1 | 8/2007 |
| WO | 2007/093914 A1 | 8/2007 |
| WO | 2007/136943 A1 | 11/2007 |
| WO | 2007/140493 A1 | 12/2007 |
| WO | 2007/148178 A1 | 12/2007 |
| WO | 2008/006424 A2 | 1/2008 |
| WO | 2008/025422 A2 | 3/2008 |
| WO | 2008/046514 A2 | 4/2008 |
| WO | 2008/052523 A1 | 5/2008 |
| WO | 2008/081026 A1 | 7/2008 |
| WO | 2008/081029 A1 | 7/2008 |
| WO | 2008/151573 A1 | 12/2008 |
| WO | 2009/010798 A1 | 1/2009 |
| WO | 2009/026912 A1 | 3/2009 |
| WO | 2009/027819 A2 | 3/2009 |
| WO | 2009/053677 A1 | 4/2009 |
| WO | 2009/074088 A1 | 6/2009 |
| WO | 2009/128910 A1 | 10/2009 |

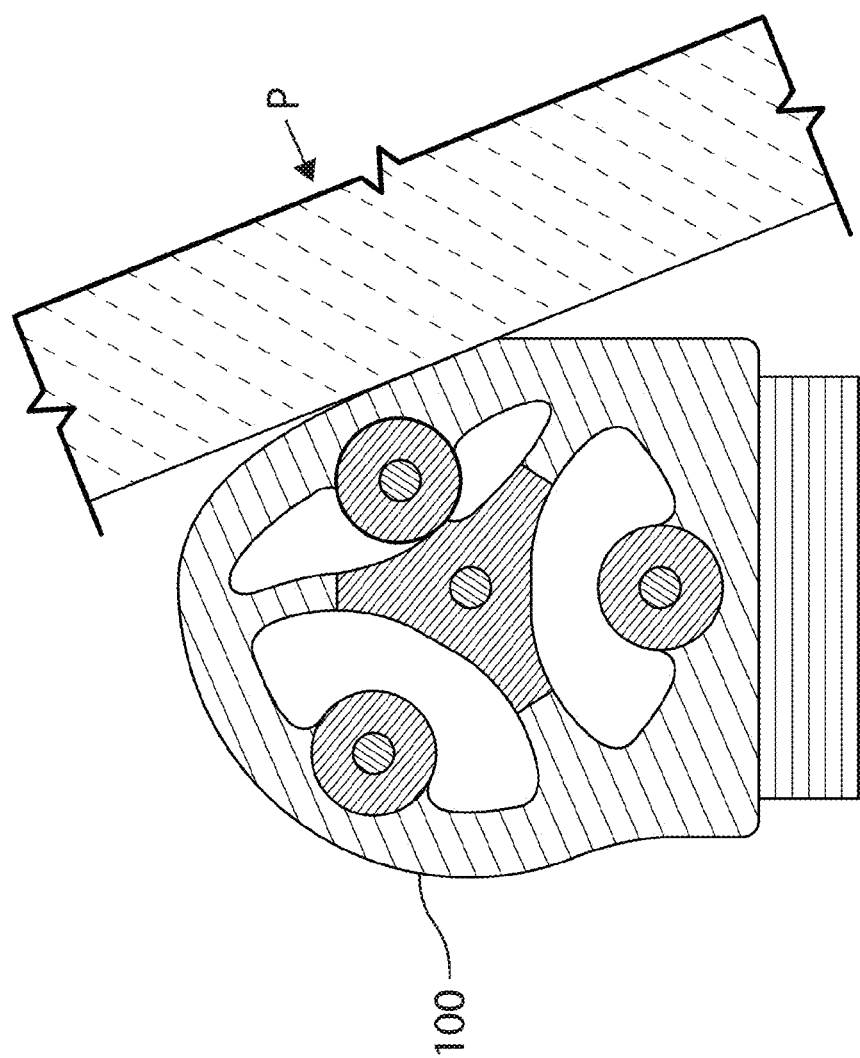

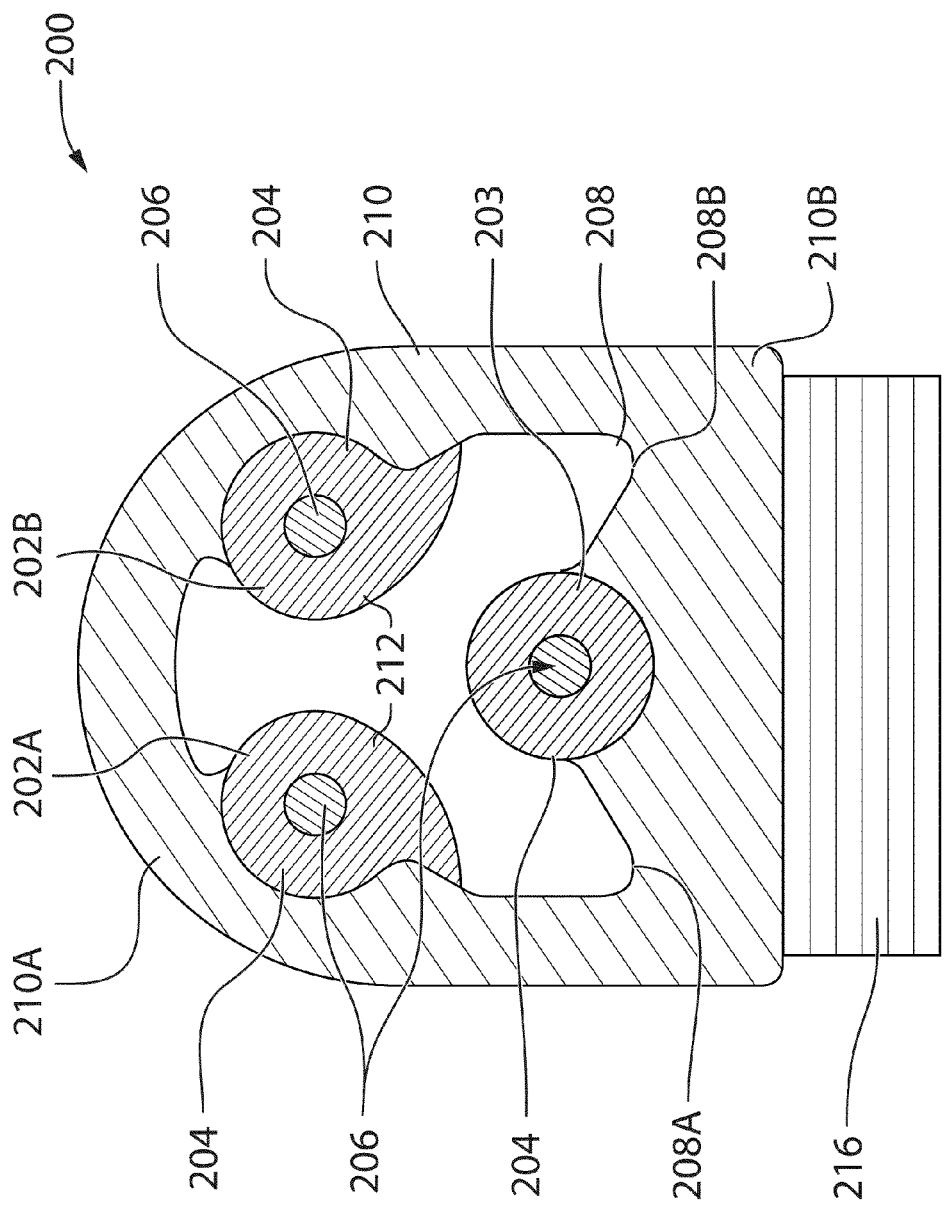

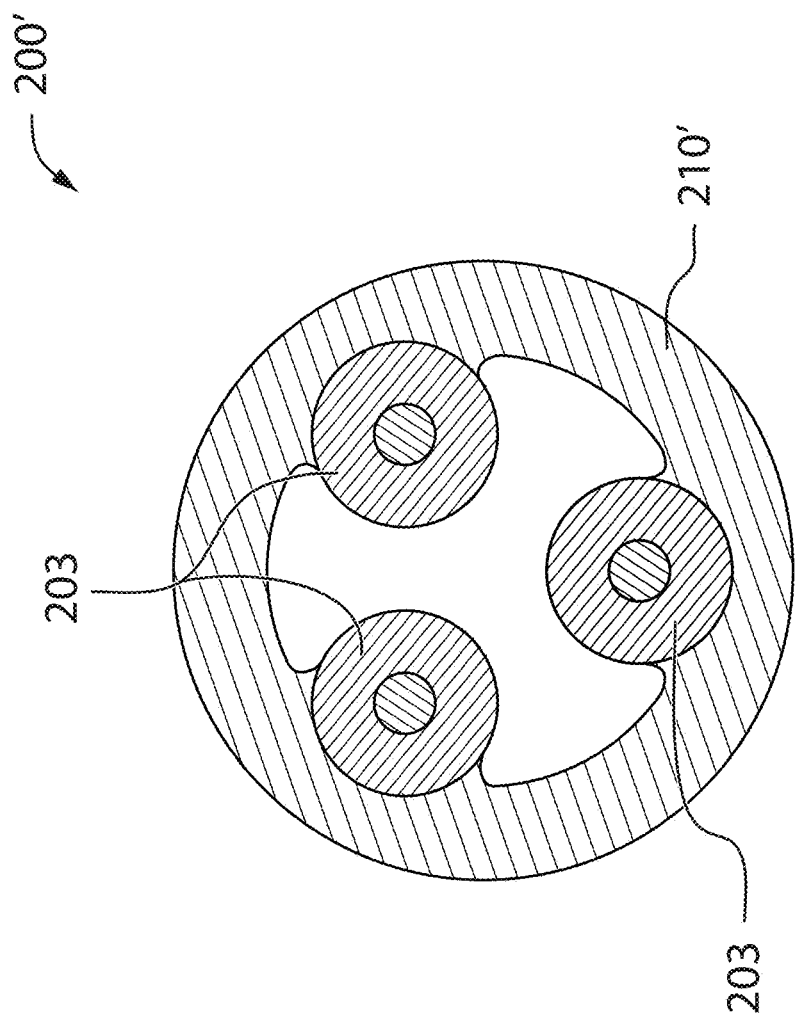

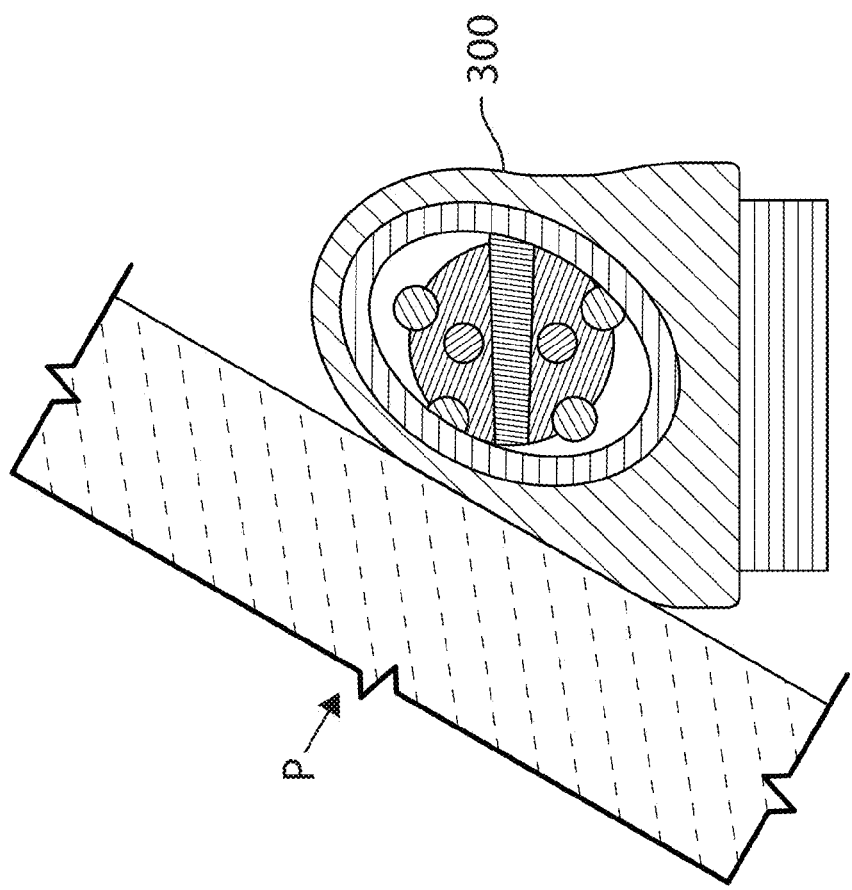

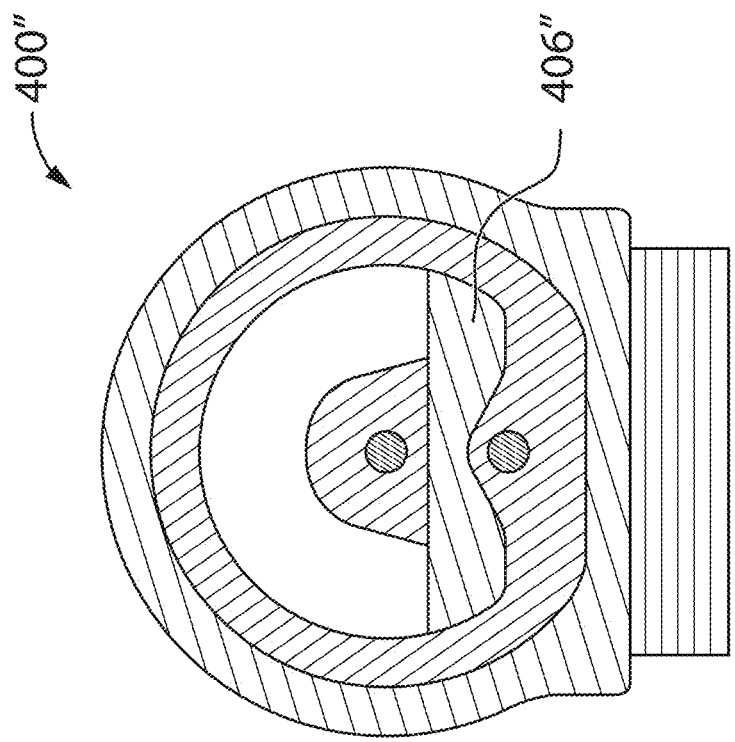
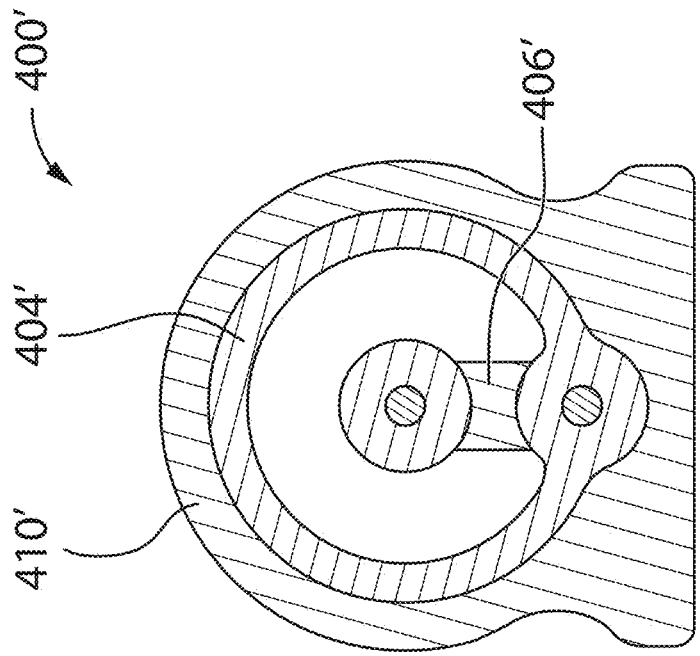
FIG.8A
FIG.8B

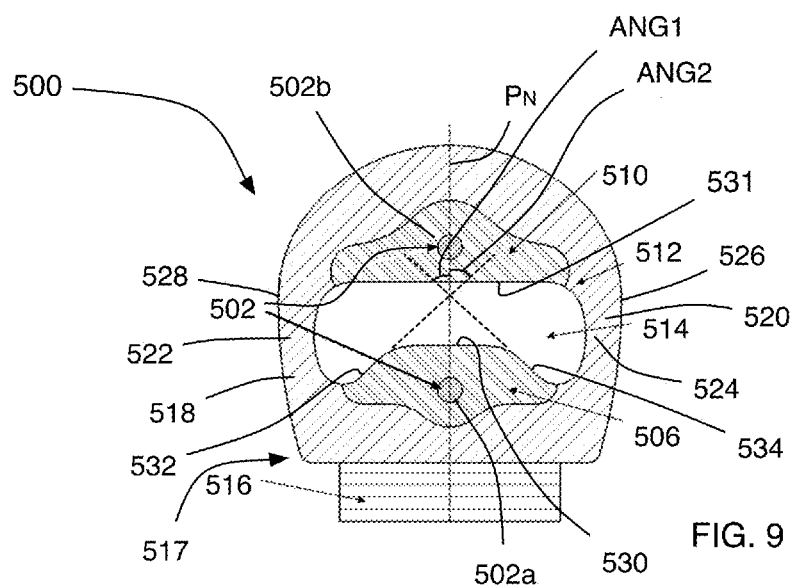
FIG. 9
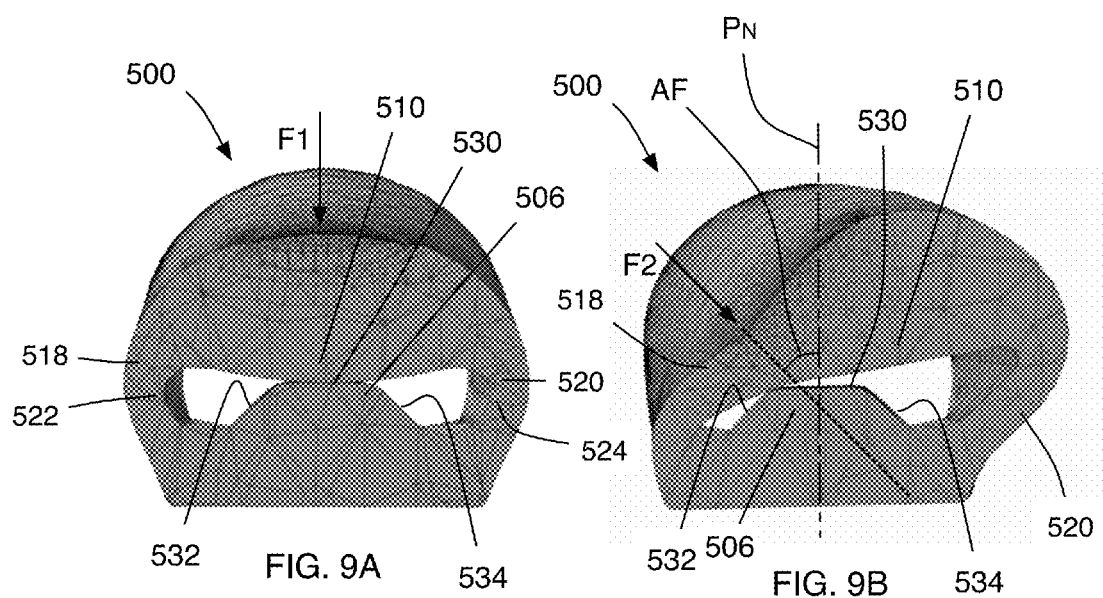
FIG. 9A
FIG. 9B

WIDE ACTIVATION ANGLE PINCH SENSOR SECTION

CROSS REFERENCE TO RELATED APPLICATIONS

This application is a divisional application of Ser. No. 13/949,203 filed Jul. 23, 2013, which claims priority to U.S. Provisional Patent Application No. 61/791,472 filed Mar. 15, 2013 and to U.S. Pat. No. 8,493,081 issued on Jul. 23, 2013, previously U.S. patent application Ser. No. 12/963,359 filed Dec. 8, 2010, which claims priority to U.S. Provisional Patent Application No. 61/267,574 filed Dec. 8, 2009, the disclosures of all of which are incorporated by reference herein in their entirety.

FIELD

This disclosure relates to pinch sensors, particularly for vehicular closure panels where it is desirable to prevent a closure panel such as a lift gate or side door from closing if a foreign obstacle or object is detected just as the panel closes.

BACKGROUND

It is known to apply pinch sensors to prevent a power-activated closure panel such as a lift gate or side door from closing if a foreign obstacle or object is detected just as the panel closes. The pinch sensors come in different forms, including non-contact sensors such as those based on capacitance changes, and contact sensors which rely on a physical deformation caused by contact with a foreign object.

The contact pinch sensors are typically applied in the form of a rubber strip which is routed along and adjacent to the periphery of a vehicle door. The rubber strip embeds two wires which are separated by an air gap. When the two wires contact one another, the electrical resistance therebetween drops, and a controller connected to the two wires monitors the drop in resistance or voltage, detecting an object when the drop exceeds a predetermined threshold. The fundamental problem with such conventional pinch sensors, however, is that they have a limited activation angle typically on the order of about thirty-five degrees per side. Thus, in the event the pinch force is applied obliquely rather than head on, the wires may not contact one another.

SUMMARY

According to one aspect a multi-lobed pinch sensor is provided. The pinch sensor includes a resiliently deformable non-conductive tubular casing having an outer wall and an inner wall that defines an internal hollow region. At least three electrically conductive conduits are disposed along the inner wall of the casing. In section, the three electrically conductive conduits are substantially equidistantly spaced circumferentially along the inner wall of the casing, and each electrically conductive conduit has a periphery that extends into the hollow region. When the casing is suitably deformed, at least one of the electrically conductive conduits comes into contact with an electrically conductive reference element to thereby lower the resistance therebetween and enable a controller to signal the detection of an obstacle.

In the pinch sensor each electrically conductive conduit may comprise an elastomeric electrically conductive skirt that envelops a low resistance electrical conductor connectable to a controller input.

In one embodiment, the casing has a cross-sectional shape of a semi-circular arch, including a base portion and a semi-circular portion. One of the electrically conductive conduits is disposed along the base portion and functions as the reference element. The other two electrically conductive conduits are disposed along the semi-circular portion. The internal hollow region includes two rebates that straddle the electrically conductive reference conduit, where each rebate presents a pivot point enabling the casing to flex such that the corresponding electrically conductive conduit disposed along the semi-circular portion is directed towards the electrically conductive reference conduit.

In another embodiment, the conductive reference element is provided by an additional electrically conductive core disposed within the casing inward of the three electrically conductive conduits. The electrically conductive core is connected to the casing by one or more non-conductive webs branching from the casing inner wall. The electrically conductive core may have a tri-petal cross-sectional shape so as to trisect the internal hollow region into three air gaps. Each of the electrically conductive conduits projects partially into one of the three individual air gaps, respectively. Each electrically conductive conduit may be formed from an elastomeric electrically conductive skirt that envelops a low resistance electrical conductor connectable to one of the controller inputs. These conductive skirts may have substantially similar circular cross-sectional profiles and the air gaps have substantially similar sector-shaped cross-sectional profiles of substantially uniform depth, thereby providing a substantially uniform travel for activating the sensor across an activation angle of at least 270 degrees.

According to another aspect, a coaxial pinch sensor is provided. The coaxial pinch sensor includes a resiliently deformable non-conductive tubular casing. An electrically conductive tubular conduit is disposed within the tubular casing, the tubular conduit having an inner wall defining an internal hollow region. An electrically conductive core is disposed within the electrically conductive tubular conduit and is normally spaced apart therefrom. When the casing is suitably deformed, the electrically conductive tubular conduit comes into contact with the electrically conductive core to thereby lower the resistance therebetween and enable a controller to signal the detection of an obstacle.

The coaxial pinch sensor may include at least one non-conductive spacing element disposed between the electrically conductive core and the electrically conductive tubular conduit.

And the electrically conductive core may be substantively coaxial with the electrically conductive tubular conduit.

According to one embodiment of the coaxial pinch sensor, multiple non-conductive spacing elements are disposed between the electrically conductive core and the electrically conductive tubular conduit, these spacing elements being resiliently compressible. In addition, the electrically conductive core may be segmented by a nonconductive divider having an end portion contacting the electrically conductive tubular conduit. And the electrically conductive core may be formed from an elastomeric electrically conductive skirt that envelops a low resistance electrical conductor.

According to another embodiment of the coaxial pinch sensor the electrically conductive tubular conduit has a cross-sectional shape of a three-quarter cylinder having a base portion and a semi-circular portion. The spacer is connected to the base portion of the electrically conductive tubular conduit. The electrically conductive core has a semi-circular cross-sectional shape, and the hollow region includes an air gap that has a substantially sector-shaped cross-sectional profile of substantially uniform depth, thereby providing a substantially uniform travel for activating the sensor across an activation angle of at least 270 degrees.

In another aspect, a pinch sensor is provided, comprising an elongate non-conductive casing having a base, a first wire and a first conductive material around the first wire, positioned inside the casing proximate the base, and a second wire and a second conductive material around the second wire, positioned inside the casing away from the base. The casing has side walls between the first and second conductive materials. The first conductive material has a central region that is a plateau, and left and right regions that slope downward towards the base from the central region towards the side walls.

In another aspect, there is provided an obstacle sensor, comprising: an elongate non-conductive casing enclosing first, second, and third elongate conductive electrodes; the first and second electrodes being separated by a portion of the casing, a capacitance between the first and second electrodes changing when an obstacle approaches the first electrode to provide a proximity indication of the obstacle to the pinch sensor; and, the second and third electrodes being separated by an air gap formed in the casing, a resistance between the second and third electrodes changing when the second and third electrodes come into contact upon compression of the casing by the obstacle to provide a contact indication of the obstacle with the pinch sensor.

In another aspect, a pinch sensor is provided, comprising an elongate non-conductive casing having a base, a first electrode formed from a first wire and a first conductive portion around the first wire, and a second electrode formed from a second wire and a second conductive material around the second wire. The first electrode is positioned inside the casing proximate the base. The second electrode is positioned inside the casing away from the base. The casing has side walls between the first and second electrodes. The second electrode has an engagement region, which has a central region, and left and right regions that extend downward towards the first electrode relative to the central region. An activation force exerted by an obstacle on the casing and directed downwards towards the base causes engagement between the first and second electrodes so as to reduce the resistance therebetween.

In another aspect, a pinch sensor is provided, comprising a non-conductive tubular casing, an electrically-conductive tubular conduit disposed within the tubular casing, the tubular conduit having an inner wall defining an internal hollow region and a core disposed within the electrically-conductive tubular conduit. The core includes a first electrode and a second electrode and a barrier that spaces the first and second electrodes from one another. A plurality of non-conductive, resilient spacers space the first and second electrodes from the electrically-conductive tubular conduit. Application of an activation force on the casing brings the first and second electrodes into contact with the tubular conduit so as to permit conduction between the first and second electrodes, so as to signal the presence of an obstacle.

Other aspects will be apparent to one skilled in the art based on the disclosure provided herein.

BRIEF DESCRIPTION OF THE DRAWINGS

The foregoing and other aspects will be more readily appreciated having reference to the drawings, wherein:

FIGS. 1A, 1B and 1C are cross-sectional views schematically demonstrating the deformation of the pinch sensor shown in FIG. 1 under loads directed from top, left and right directions, respectively;

FIG. 3 is a cross-sectional view of a tri-lobed pinch sensor according to a second embodiment;

FIG. 4 is a cross-sectional view of a variant of the pinch sensor shown in FIG. 3;

FIGS. 5A, 5B and 5C are cross-sectional views schematically demonstrating the deformation of the pinch sensor shown in FIG. 5 under loads directed from top, left and right directions, respectively;

FIGS. 8A and 8B are cross-sectional views of variants of the pinch sensor shown in FIG. 7;

FIG. 9 is a cross-sectional view of another embodiment of a resistive pinch sensor;

FIGS. 9A and 9B are finite element models illustrating the deformation of the pinch sensor shown in FIG. 9 under different loads;

DETAILED DESCRIPTION

Figure 1:
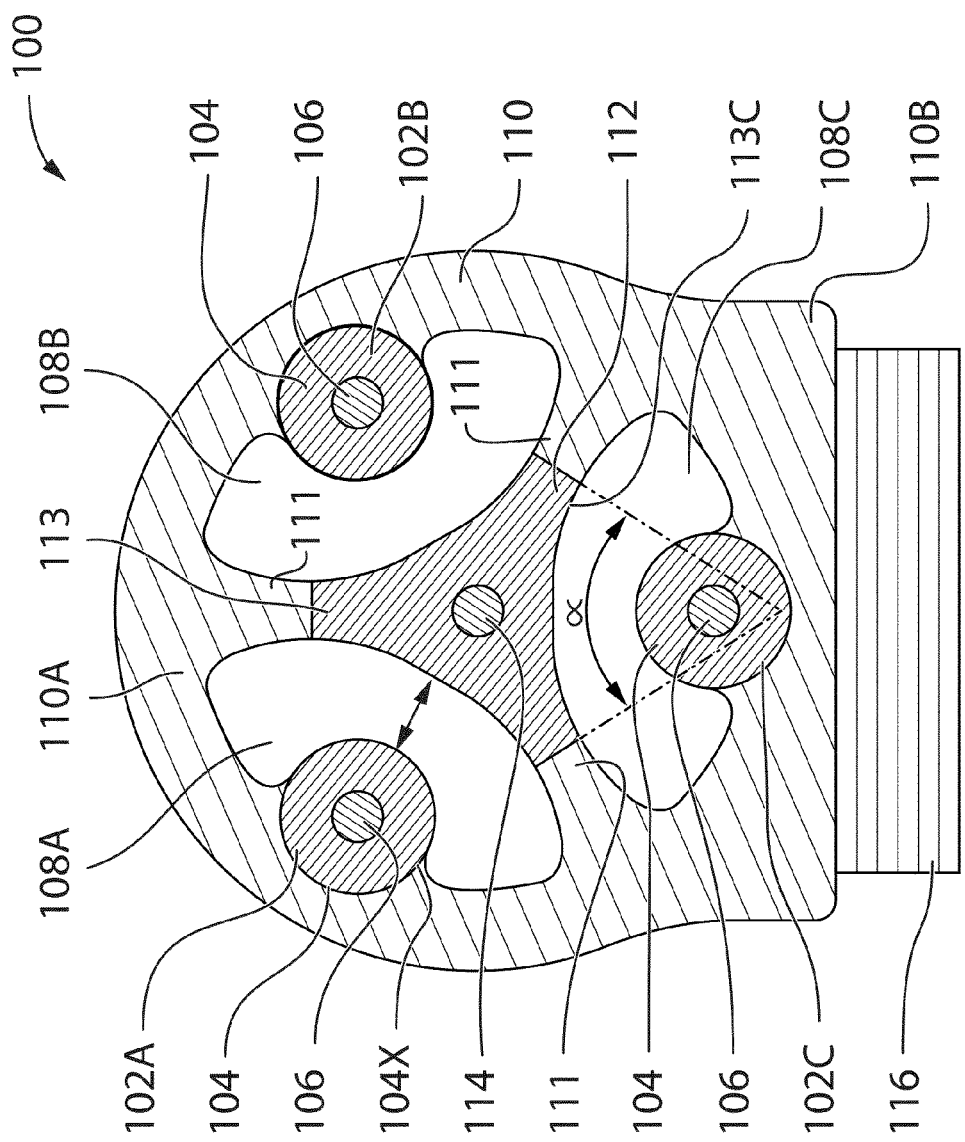
FIG. 1 is a cross-sectional view of a tri-lobed pinch sensor according to a first embodiment.

FIG. 1 shows a tri-lobed pinch sensor 100 in cross-sectional view. The sensor 100 is configured as an elongate bendable strip, but it should be understood that the cross-sectional profile shown in FIG. 1 is substantially constant along the length of the strip (and do not follow a helical pattern). As such, the pinch sensor 100 may be relatively easily manufactured by extrusion or co-extrusion techniques as known in the art per se.

The particular pinch sensor 100 shown in FIG. 1 achieves a relatively wide activation range or angle by incorporating three electrically conductive conduits 102 (labeled individually as 102a, 102b, 102c) within a non-conductive tubular casing 110. In section, the electrically conductive conduits 102, which are alternatively referred to as conductive 'planetary' lobes, are substantially equidistantly spaced circumferentially along the inner wall of the tubular casing 110 about a central electrically conductive core 112. The planetary lobes 102 are insulated from the central conductive core 112 by a hollow region 108 but upon application of a suitable pinch force to deform the tubular casing 110 at least one of the conductive planetary lobes 102 will come into contact with the conductive central core 112, lowering the resistance therebetween, and enabling a controller (not shown) connected to the conductive planetary lobes 102 and central core 113 to signal the presence of an obstacle. The three conductive planetary lobes 102 can be connected to one voltage polarity, and the conductive central core 112 to an opposite voltage polarity.

More particularly, each planetary lobe 102 includes a conductive skirt 104 that may be formed from an elastomeric conductive material, e.g., conductive rubber as known in the art per se. The conductive skirt 104 surrounds a low resistance 'outboard' electrical conductor 106, discussed in greater detail below, that is connected to one of the controller inputs (all three electrical conductors being connectable to the same controller input). Each skirt 104 may be formed in a closed loop shape such as the illustrated circular shape so as to envelop the corresponding outboard electrical conductor 106, although it will be understood that a complete encirclement is not essential.

The central conductive core 112 includes a conductive tri-petal or trilateral body 113 that may be formed from the same material as the conductive skirt 104. The trilateral body 113 may surround a low resistance central electrical conductor 114 that is disposed along the longitudinal axis of the pinch sensor 100 and is connected to another input of the controller.

The three planetary lobes 102 are partially embedded in a resiliently deformable, non-conductive tubular casing 110, as may be provided by rubber, that forms the outer periphery of the sensor 100. The casing 110 encapsulates the conductive portions of the sensor, protecting it from ambient influences. The casing 110 also defines the stiffness of the section and its appearance. The casing 110 has a generally annular shaped peripheral cross-sectional profile (e.g., a three-quarter cylinder as illustrated) with three integrally formed, inwardly leading web portions 111. The central trilateral body 113 has three corners that are each integrally connected to one of three web portions 111 to thus trisect the casing 110 and define three distinct air gaps labeled individually as 108a, 108b, 108c.

In the illustrated embodiment about one half 104j of the outer periphery of each conductive skirt 104 abuts the casing 110, and about one half 104k of the outer periphery of each conductive skirt 104 projects into one of the air gaps 108a, 108b, 108c. Each air gap may be crescent or sector shaped in section with uniform depth and sized to permit about one hundred and eighty degrees of the outer periphery of the respective conductive skirt 104 to project into the air gap. The crescent or sector shape of the air gap 108, coupled with the circular shape of the planetary conductive skirt 104, also provides a relatively uniform depth d across the air gap 108 between the projecting portion 104k of the planetary conductive skirt 104 and the corresponding sidewall 113a, 113b, 113c of the central trilateral body 113. The distance d is selected to achieve a selected deformation of the casing 110 before one of the planetary lobes 102 contacts the central core 112. The sensor 100 may have a relatively constant activation travel or distance over a wide range of pinch directions.

Figure 1A:
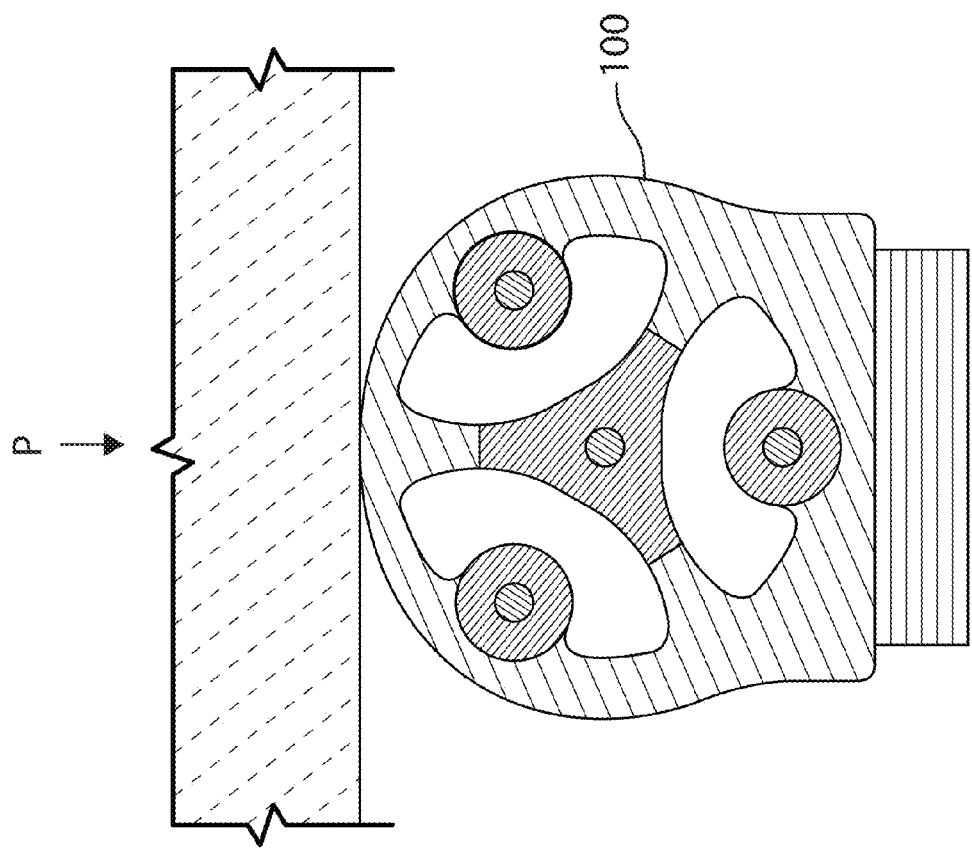
Figure 1B:
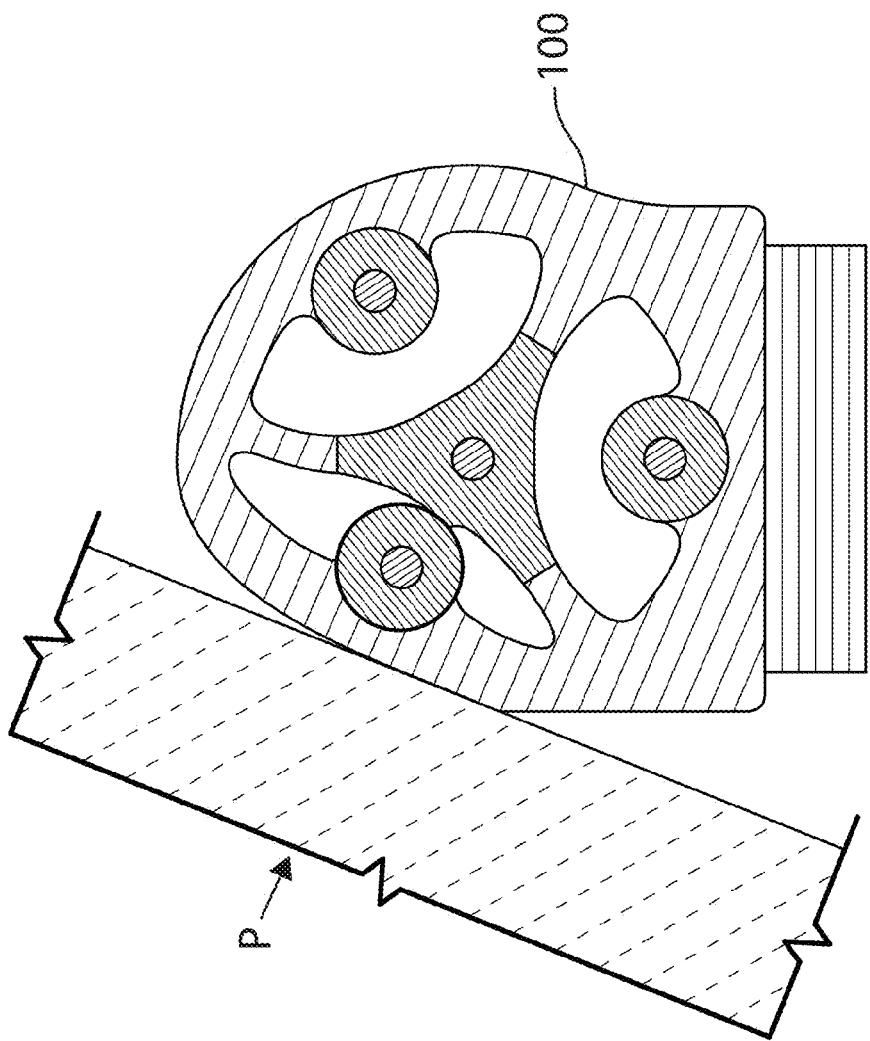

Each sidewall 112a, 112b, 112c of the central trilateral body 112 faces one of the projecting portions 104k of the planetary conductive skirt 104 and subtends it by an angle alpha of about one hundred twenty degrees. As the three planetary lobes 102 are angularly spaced apart from one another by about one hundred and twenty degrees, it will be seen that the pinch sensor 100 has a very wide activation angle. This can be appreciated more fully with additional reference to FIGS. 1A, 1B, and 1C which demonstrate how the sensor 100 reacts when a pinch force P is applied from top, left and right positions, respectively, and from which it should be appreciated that the sensor 100 has an activation angle of at least about 170 degrees.

Figure 2:
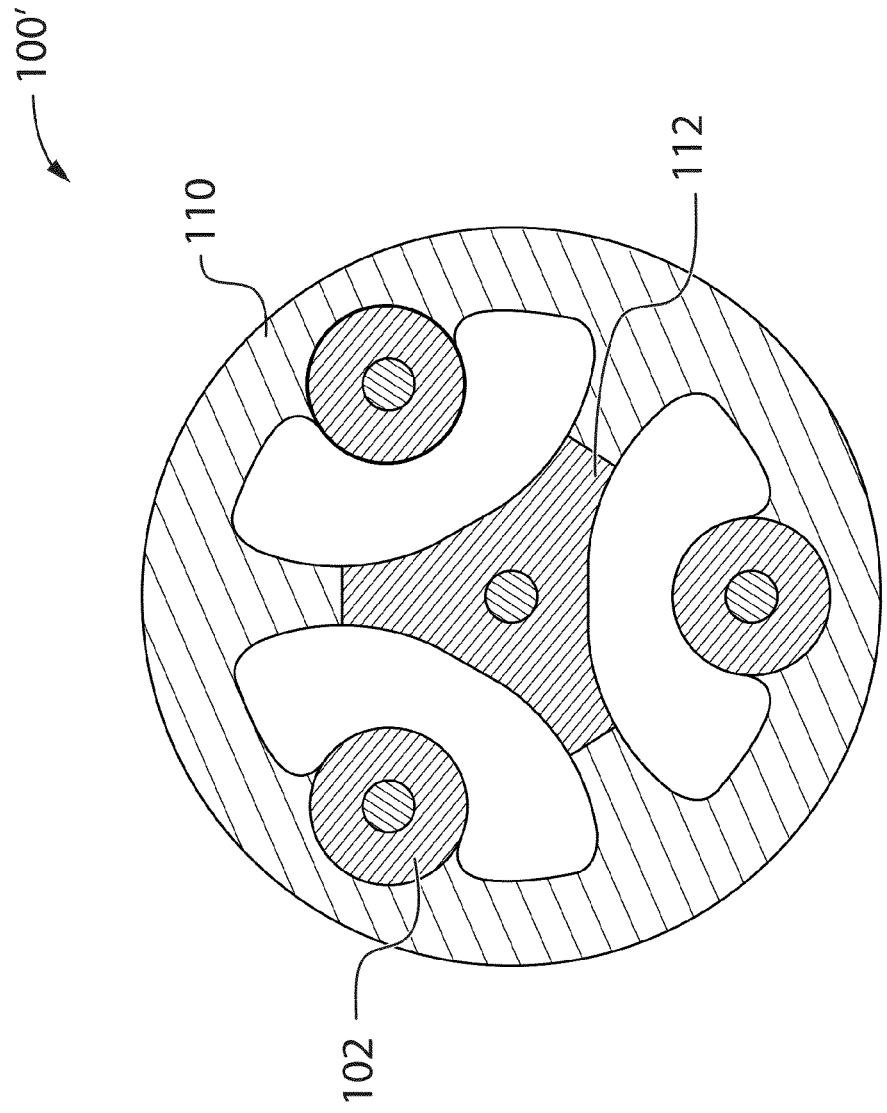
FIG. 2 is a cross-sectional view of a variant of the pinch sensor shown in FIG. 1.

As shown in FIG. 1 the casing 110 features a flattened end portion 110b in order to provide a flat surface to mount an adhesive strip 116 thereto for attaching the sensor to the contours of a support surface. It will be appreciated that in other embodiments such as shown in FIG. 2 a variant 100' of the pinch sensor can have a completely circular casing 110' which will thus permit an even larger activation angle, which can be as high as 360 degrees.

In some embodiments the electrical conductors 106 and 114 are formed from multiple strands of wire such as copper combined with plastic reinforcing fiber. Such conductors can provide high elasticity in both axial (stretching) and transverse (bending) directions.

Figure 3A:
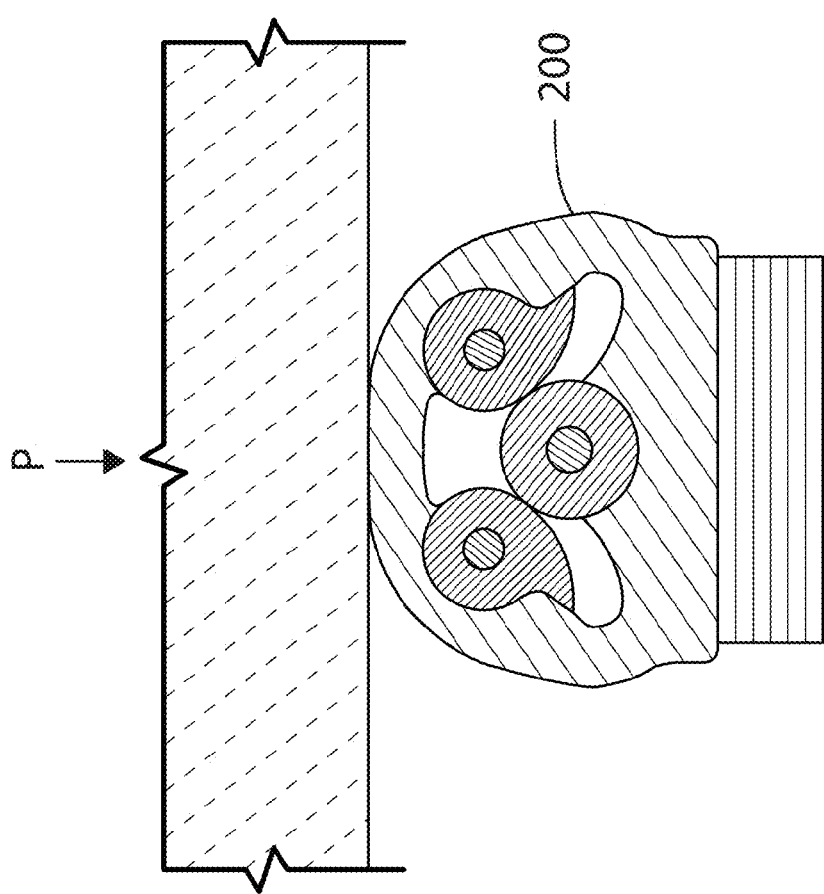
FIGS. 3A, 3B and 3C are cross-sectional views schematically demonstrating the deformation of the pinch sensor shown in FIG. 3 under loads directed from top, left and right directions, respectively.
Figure 3B:
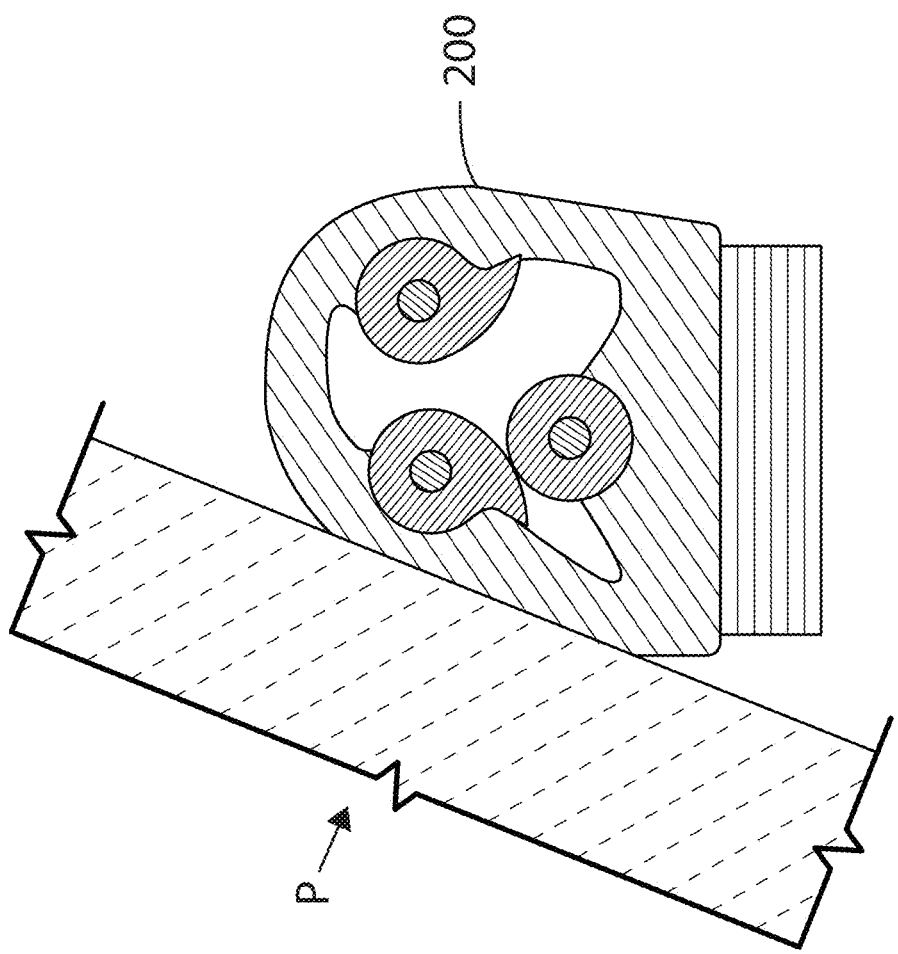
Figure 3C:
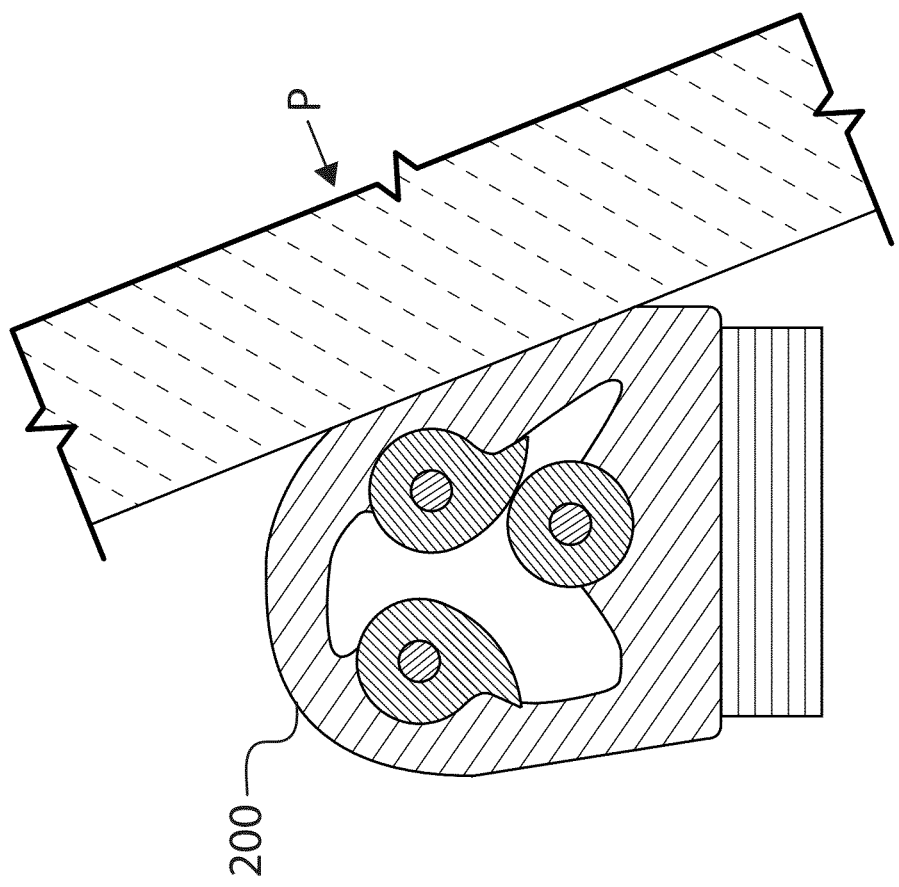

FIG. 3 shows an alternative embodiment of a tri-lobed pinch sensor 200 in cross-sectional view. The sensor 200 is configured as an elongate bendable strip, but it should be understood that the cross-sectional profile shown in FIG. 3 is substantially constant along the length of the strip (and does not follow a helical pattern), enabling the pinch sensor 200 to be relatively easily manufactured by extrusion or co-extrusion techniques.

The pinch sensor 200 achieves a relatively wide activation range or angle by incorporating three electrically conductive conduits 202a, 202b, and 203 within a non-conductive tubular casing 210. In section, the electrically conductive conduits 102, which are alternatively referred to as conductive lobes, are substantially equidistantly spaced circumferentially along the inner wall of the tubular casing 210 and/or about a central cylindrical axis 214. The upper lobes 202a, 202b are insulated from one another by a central, common, air gap 208, but upon application of a suitable pinch force to deform the tubular casing 210 one of the conductive upper lobes 202, which are connected to one input of a controller (not shown), will come into contact with the conductive lower or base lobe 203, which is connected to another input of the controller, lowering the resistance therebetween, and thus enabling the controller (not shown) to signal the presence of an obstacle.

More particularly, each conductive lobe 202, 203 includes a conductive skirt 204 that may be formed from an elastomeric conductive material, e.g., conductive rubber as known in the art per se. The conductive skirt 204 surrounds a low resistance electrical conductor 206, such as discussed above, that is connected to a controller input. Each skirt 204 may be formed in a closed loop shape such as the illustrated circular shape so as to envelop the corresponding electrical conductor 206, although it will be understood that a complete encirclement is not essential. The conductive skirts 204 of the upper lobes 202 also include teardrop shaped tail sections 212 that provides a wider face (in comparison with a strict circular profile) relative to the base lobe 203.

Each of the conductive lobes 202 is partially embedded in the resiliently deformable, non-conductive tubular casing 210, as may be provided by rubber, that forms the outer periphery of the sensor 200. The casing 210 encapsulates the conductive portions of the sensor, protecting it from ambient influences. The casing 210 also defines the stiffness of the section and its appearance. The particular casing 210 illustrated in FIG. 3 has a generally inverted U-shaped or semi-circular arch profile in section, including a semicircle portion 210 and a base portion 201b. The casing 210 also includes a hollow central region that defines the air gap 208.

In the illustrated embodiment about one half of the outer periphery of each conductive skirt 204 abuts the tubular casing 210, and about one half of the outer periphery of each conductive skirt 204 projects into the air gap 208. The air gap 208 includes two lower recesses or rebates 208a, 208b that present pivot points to allow the casing 210 to flex such that the conductive upper lobes 202 are directed towards the conductive base lobe 203 that is situated adjacent the base of inverted U-shaped casing 210. The tri-lobed pinch sensor 200 also has a wide activation angle as will be appreciated more fully with additional reference to FIGS. 2A, 2B, and 2C which demonstrate how the sensor 200 reacts when a pinch force P is applied from top, left and right positions, respectively, and from which it should be appreciated that the sensor 200 has an activation angle of at least about 170 degrees.

As shown in FIG. 3 the flattened base portion 210b of the casing 210 provides a flat surface for mounting an adhesive strip 216 to attach the sensor to an underlying support surface. It will be appreciated that in other embodiments such as shown in FIG. 4 a variant 200' of the pinch sensor can have a completely circular casing 210' with three equidistantly angularly spaced circumferential conductive lobes 203, which will thus permit an even larger activation angle.

Figure 5:
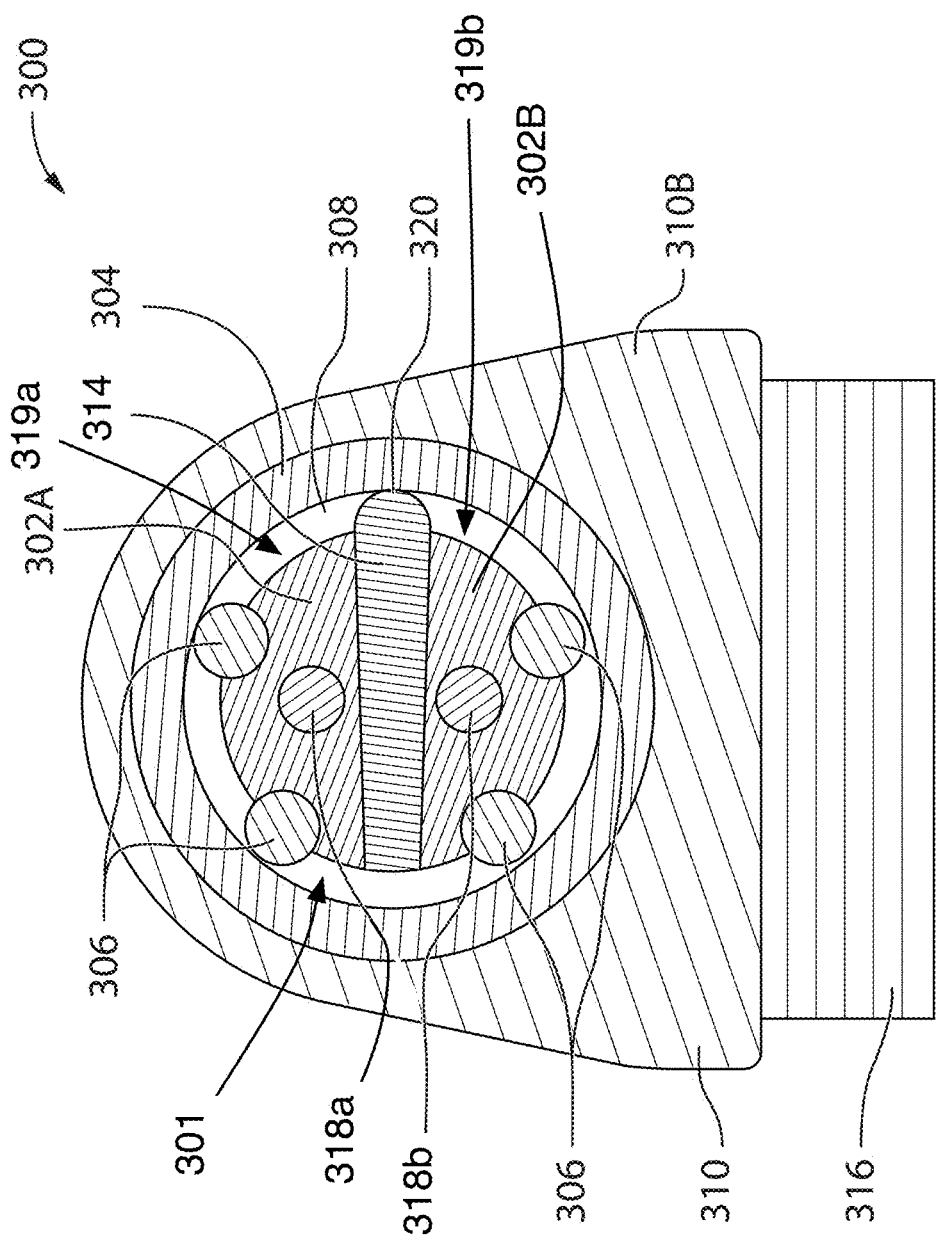
FIG. 5 is a cross-sectional view of a coaxial pinch sensor according to a third embodiment.

FIG. 5 shows an embodiment of a coaxial pinch sensor 300 in cross-sectional view. The sensor 300 is also configured as an elongate bendable strip, and it will be understood that the cross-sectional profile shown in FIG. 5 is substantially constant along the length of the strip.

Figure 5A:
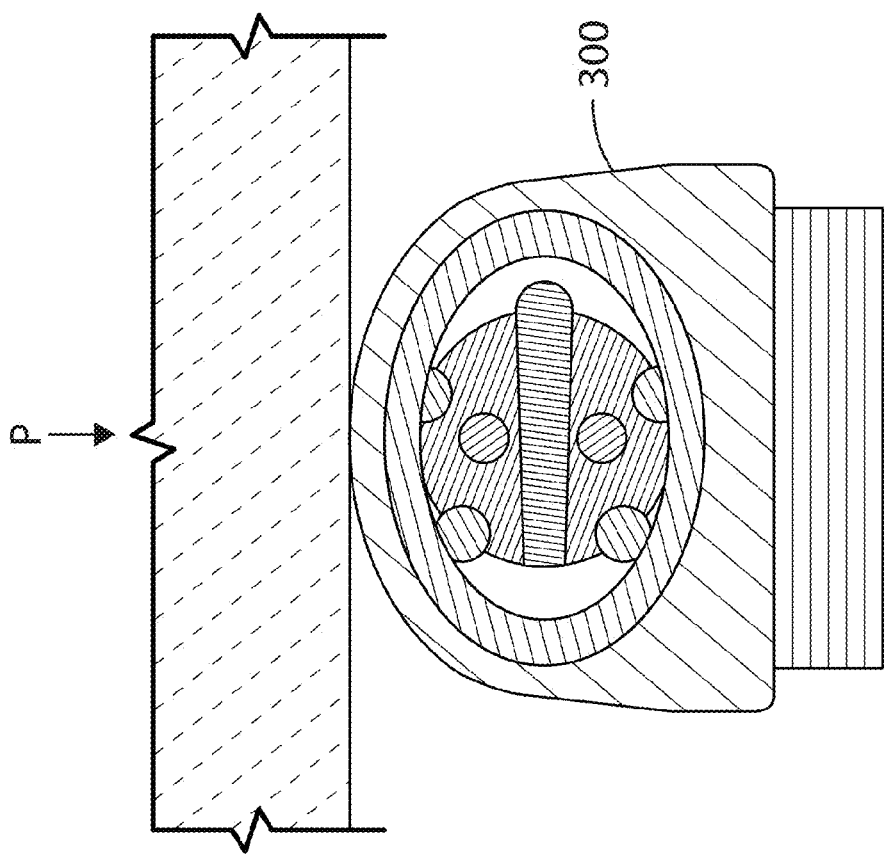
Figure 5C:
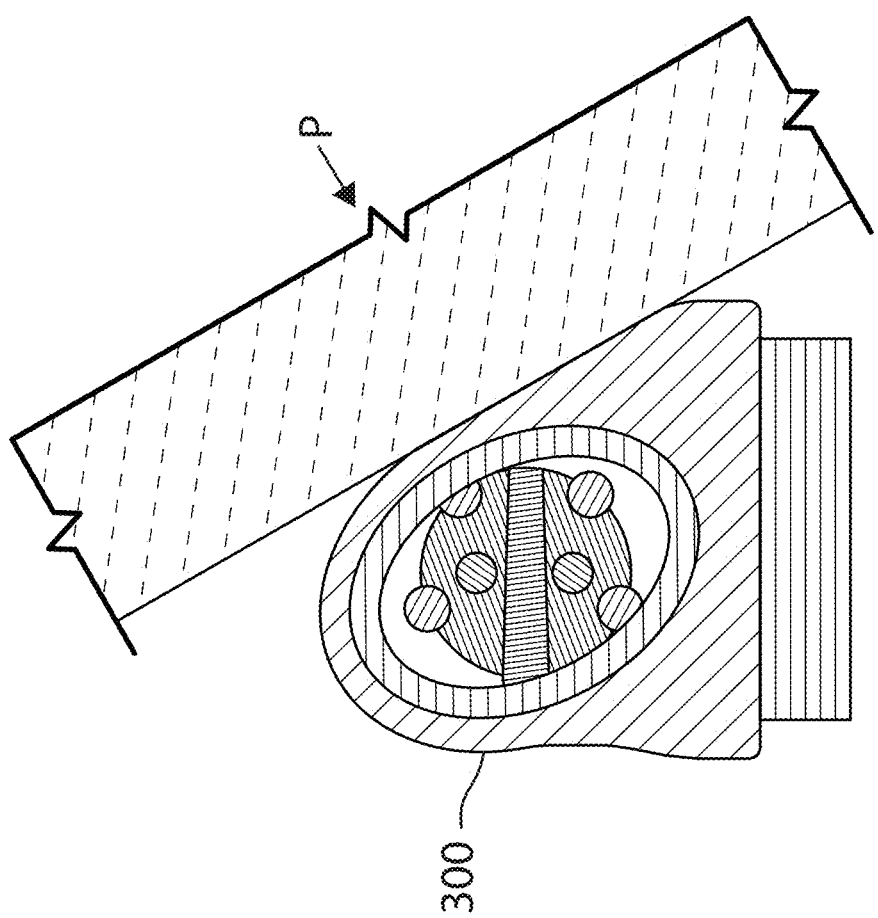

The coaxial pinch sensor 300 achieves a wide activation range or angle by incorporating a core 301 with two wires shown at 318a and 318b, which are embedded in conductive portions 302A and 302B respectively (thereby forming first and second electrodes 319a and 319b, and a coaxial electrically conductive tubular outer sheath 304 within a tubular casing 310. The electrodes 319a and 319b are separated by a barrier 314 which prevents conduction thereacross from one electrode to the other. The conductive core 301 and conductive sheath 304 are normally spaced apart by a plurality of non-conductive spacers/springs 306. Upon application of a suitable pinch force to deform the tubular casing 310, the conductive sheath 304 will come into contact with both electrodes 319a and 319b (as shown in FIGS. 5A, 5B and 5C), thereby permitting conduction from one electrode into the other and reducing the resistance therebetween, thereby signaling to a controller that an obstacle is present.

More particularly, the coaxial sensor 300 includes a resiliently deformable, non-conductive tubular casing 310, as may be provided by rubber, that forms the outer periphery of the sensor 300. The particular casing 310 illustrated in FIG. 5 has a cylindrical inner wall and encapsulates the conductive portions of the sensor, protecting it from ambient influences. The casing 310 also defines the stiffness of the section and its appearance. The particular casing 310 illustrated in FIG. 5 has a flattened base section 310b to which an adhesive foam strip 316 can be applied to mount the sensor to a support surface.

The casing 310 has an evacuated central region. The conductive outer sheath 304 is disposed immediately adjacent the inner wall of the casing 310 and may also be cylindrical to ensure a mating fit therewith. The central core 301 is disposed within the outer sheath 304, being substantially coaxial therewith. The core 301 also has a smaller diameter than the outer sheath 304 so as to leave an air gap 308 therebetween.

The conductive cylindrical outer sheath 304 may be formed from an elastomeric material, such as conductive rubber.

The central core 301 is provided as two semi-cylinders 302A, 302B separated by the barrier 314, which may also be referred to as a divider 314. Each semi-cylinder 302A and 302B may be formed from an elastomeric conductive material, e.g., conductive rubber, and envelops one of the low resistance electrical conductors 318a or 318b, as discussed above, that is connected to a controller input.

The divider 314 is formed from a nonconductive material, such as rubber, and has a bulbous end portion 320 that contacts the cylindrical outer sheath 304.

The spacers/springs 306 are non-conductive, resiliently deformable beads that are partially embedded in the semi-cylinders 302A, 302B. About half of the periphery of the spacers/springs 306 project into the air gap 308 so as to contact the conductive outer sheath 304 and prevent self activation of the sensor 300 due to sharp routing bends. The shape, quantity, position and stiffness of the spacers/springs 306 are selected to achieve a desired sensor activation force and travel.

The coaxial nature of sensor 300 enables a wide activation angle as will be appreciated more fully with additional reference to FIGS. 5A, 5B, and 5C which demonstrate how the sensor 300 reacts when a pinch force P is applied from top, left and right positions, respectively, and from which it should be appreciated that the sensor 300 has an activation angle of at least about 170 degrees.

Figure 6B:
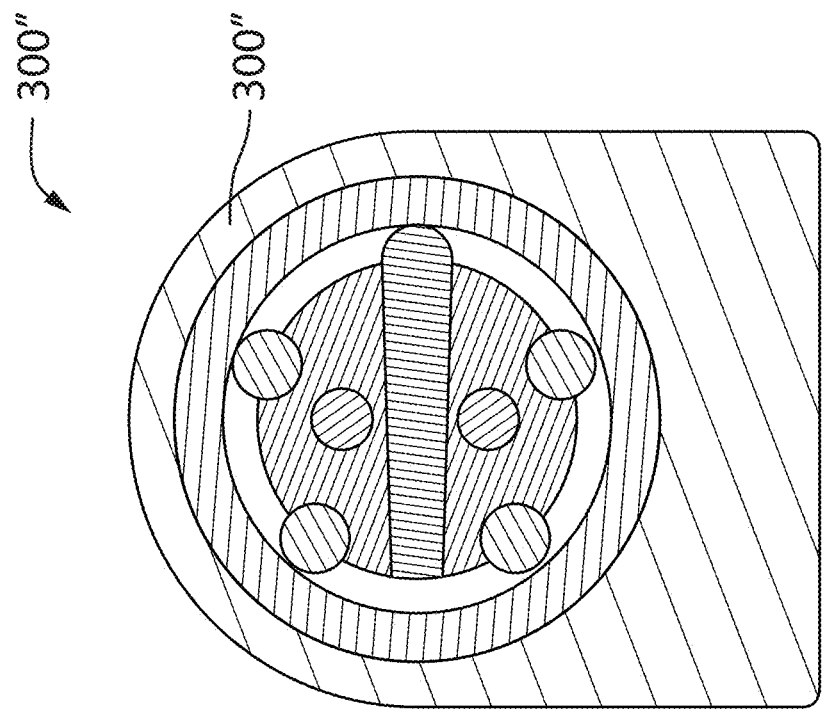
FIGS. 6A and 6B are cross-sectional views of variants of the pinch sensor shown in FIG. 5.
Figure 6A:
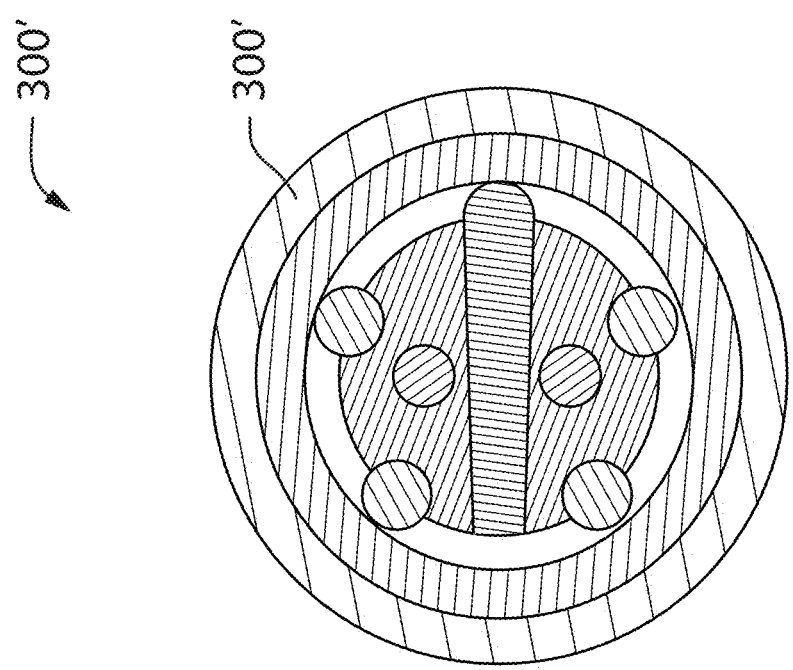

FIGS. 6A and 6B shown variants 300' and 300" of the coaxial pinch sensor which employ differently shaped casings 310' and 310".

Figure 7:
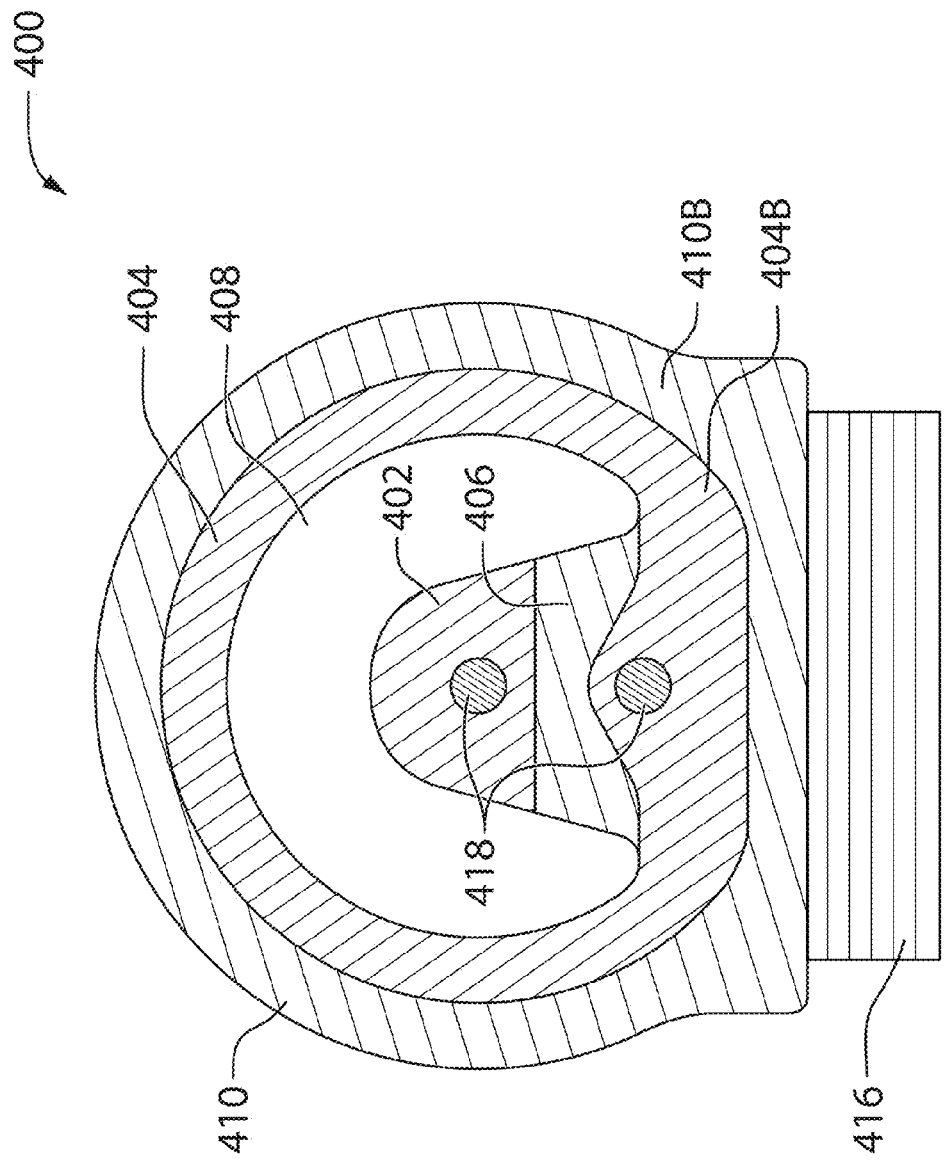
FIG. 7 is a cross-sectional view of a coaxial resistive pinch sensor according to another embodiment.

FIG. 7 shows an alternative embodiment of a coaxial pinch sensor 400 in cross-sectional view. The sensor 400 is also configured as an elongate bendable strip, and it will be understood that the cross-sectional profile shown in FIG. 7 is substantially constant along the length of the strip.

The coaxial pinch sensor 400 achieves a wide activation range or angle by incorporating a substantially electrically conductive central core 402 and a substantially coaxial electrically conductive tubular outer sheath 404 encapsulated by a nonconductive tubular casing 410. The conductive core 402 and conductive sheath 404 are normally spaced apart by an uvula-like base structure 406 projecting from the outer sheath 404, but upon application of a suitable pinch force to deform the casing 410 the conductive outer sheath 404, which is connected to one input of a controller (not shown), will come into contact with the conductive core 402, which is connected to another input of the controller, lowering the resistance therebetween and enabling the controller (not shown) to signal the presence of an obstacle.

More particularly, the coaxial pinch sensor 400 includes a resiliently deformable, non-conductive tubular casing 410, as may be provided by rubber, that forms the outer periphery of the sensor 400. The casing 410 encapsulates the conductive portions of the sensor, protecting it from ambient influences.

The casing 410 also defines the stiffness of the section and its appearance. The particular casing 410 illustrated in FIG. 7 has three-quarter cylindrical shape including a flattened base section 410b to which an adhesive foam strip 416 can be applied to mount the sensor to a support surface.

The outer sheath 404 is disposed immediately adjacent an inner wall of the casing 410 and may also be shaped in the form of a three-quarter cylinder to matingly fit with the casing 410. The conductive core 402 is disposed within the outer sheath 404, being substantially coaxial therewith. The conductive core 402 also has a smaller diameter than the outer sheath 404 so as to leave an air gap 408 therebetween.

The conductive outer sheath 404 may be formed from an elastomeric material, such as conductive rubber. The outer sheath 404 includes a base portion 404b that envelops and surrounds a low resistance electrical conductor 418, such as discussed above, that is connected to a controller input.

The uvulate base structure 406 is a nonconductive platform disposed atop the base portion 404b. The conductive core 402, which may be formed from an elastomeric conductive material such as conductive rubber is disposed atop the base structure 406 and envelops a low resistance electrical conductor 418, such as discussed above, that is connected to a controller input. The base structure 406 maintains a minimum spacing between the electrical conductors 418 embedded in the core 402 and sheath 404 and prevents the collapse of the section under sharp bends in the coaxial strip sensor 400. As such, the base structure 406 may also be referred to as an insulative layer, or as a non-conductive spacer layer.

Figure 7A:
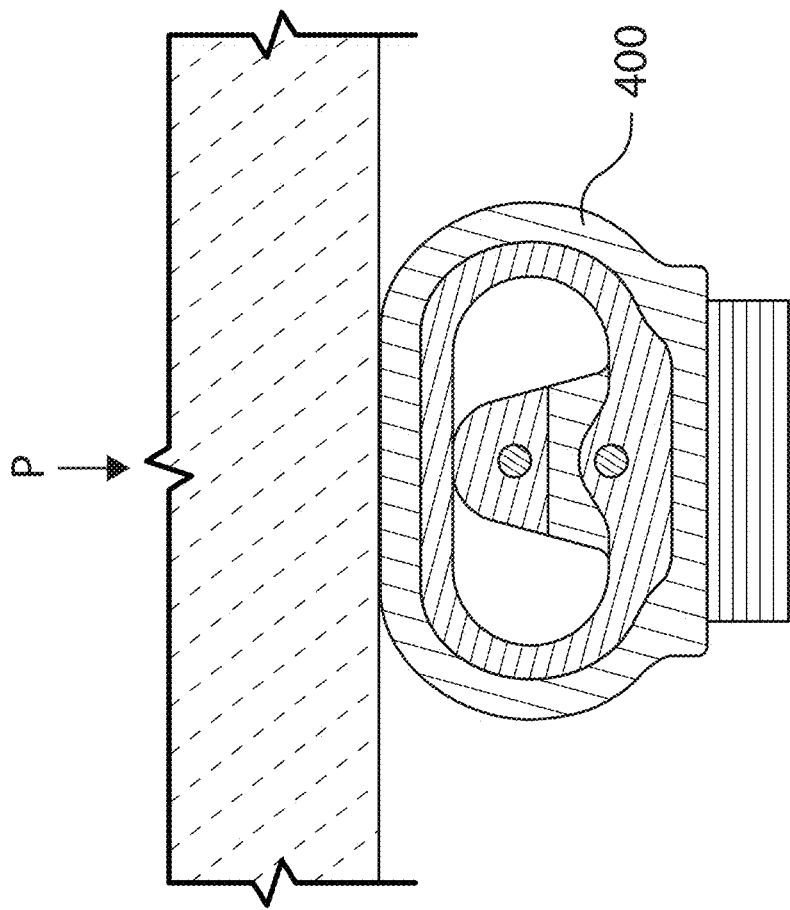
FIGS. 7A, 7B and 7C are cross-sectional views schematically demonstrating the deformation of the pinch sensor shown in FIG. 7 under loads directed from top, left and right directions, respectively.
Figure 7B:
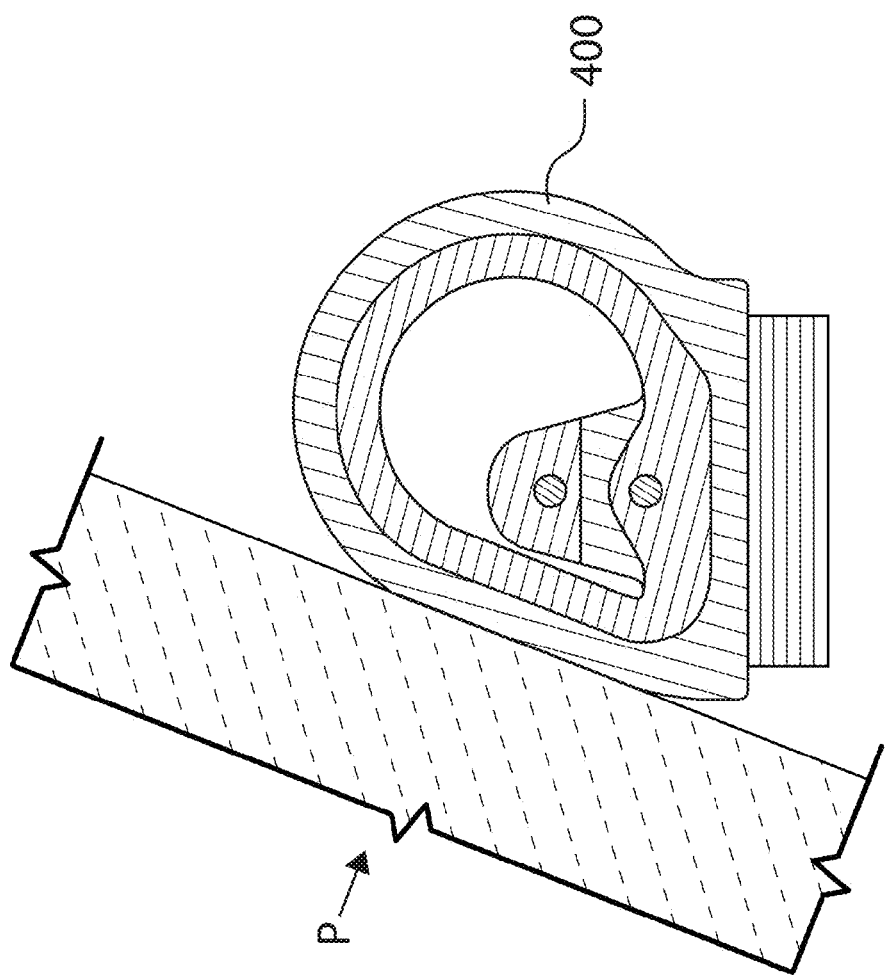
Figure 7C:
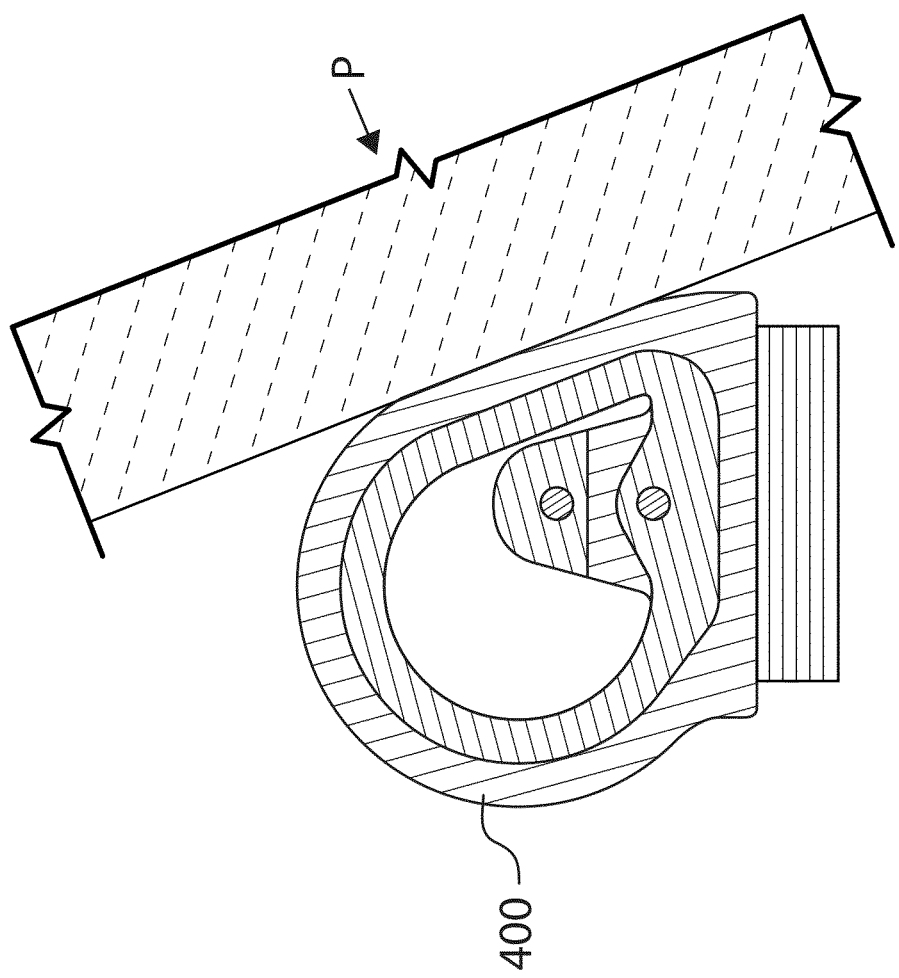

In the illustrated embodiment the conductive core 402 has a substantially three-quarter circle cross-sectional profile. The air gap 408 may be crescent or sector shaped in section over an angular range of about 270 degrees. The crescent or sector shape of the air gap 408, coupled with the three-quarter circular shape of the conductive core, provides a relatively uniform depth d across the air gap 408 and thus a relatively constant activation travel over a wide range of pinch directions. This will be appreciated more fully with additional reference to FIGS. 7A, 7B, and 7C which demonstrate how the sensor 400 reacts when a pinch force P is applied from top, left and right positions, respectively, and from which it should be appreciated that the sensor 400 has an activation angle of at least about 170 degrees.

FIG. 8A shows a variant 400' of the coaxial pinch sensor which employs a more cylindrical casing 410' and outer sheath 404', along with a narrower uvulate base structure 406', thereby enabling an even wider range of activation angles. FIG. 8B shows a variant 400" of the coaxial pinch sensor which employs a broader uvulate base structure 406", resulting in a more limited range of activation angles.

A sensor 500 using a more flexible conductor (items 502, identified individually as 502a and 502b) and a new shape for the lower conductive material (also referred to as a conductive portion or body or sheath and shown at 506) and side walls is shown below.

Item 506 is the conductive material around lower wire 502a. It enables transfer of electrical contact to the lower wire 502a.

Item 510 is the conductive material (also referred to as a conductive portion or body or sheath 510) around upper wire 502b, which enables electrical contact to the upper wire 502b.

Item 512 is the casing (non-conductive material), which encapsulates conductive portion of sensor 500. It protects the sensor 500 from ambient influence and defines overall section stiffness and appearance. Its stiffness and shape defines sensor activation force.

Item 514 is an air gap, which provides insulation between conductive portions 506 and 510 of sensor section when sensor 500 is not in an activated state. Its size ensures that sensor 500 doesn't self-activate in the case of tight routing and/or manufacturing variation.

Each wire 502 is a special electrical conductor, which transfers electrical contact information from sensor functional area to the attached wire harness. Its design (multiple strands combined with plastic reinforcing fiber) enables high elasticity in both axial (stretching) and transverse (bending) direction.

Item 516 is foam tape which attaches sensor to its carrier.

The above sensor design gets activated if pressed perpendicularly to the base (shown at 517) or in some embodiments up to a range of 37.5 degrees off that direction (each side).

The sensor 500 is further described below.

The first wire 502a and the first conductive portion 506 are positioned inside the casing 512 proximate the base 517. The second wire 502b and the second conductive portion 510 are positioned inside the casing 512 away from the base 517.

The casing 512 has a first casing portion 518 and a second casing portion 520 which are unattached to the conductive portions 506 and 510 and which constitute the aforementioned side walls between the first and second conductive portions 506 and 510. The height and thickness of the side walls 518 and 520 may be selected to provide sufficient flexibility to permit activation of the sensor 500 (i.e. engagement of the upper conductive portion 510 with the lower conductive portion 506) using not more than a selected activation force, but to also provide sufficient strength to prevent the casing 512 from collapsing causing engagement of the upper conductive portion 510 with the lower conductive portion 506 in regions where the sensor 500 is routed along a path that curves upwards or downwards with a short bend radius.

The shape of the casing 512 may be formed from a first (lower) arcuate portion 512a having a first radius of curvature, and a second (upper) arcuate portion 512b having a second radius of curvature. The first and second radii are non-concentric. At points 522 and 524 the upper and lower portions 512a and 512b intersect, the thickness of the side walls is at a relative minimum, thereby forming natural bend points in the casing 512, such that the points 522 and 524 are the points at which the side walls 518 and 520 bend when the sensor 500 incurs a downwardly directed activation force. Additionally, it will be noted that the bend points 522 and 524 occur in regions of the side walls 518 and 520 that slope inwardly towards the base 517. In other words, the bend points 522 and 524 are located below the lateral maxima of the casing 512, shown at 526 and 528. By forming the casing 512 as described above, the side walls 518 and 520 bend outwards in a controlled way when the sensor 500 is exposed to a downwardly directed activation force (shown at F1 in FIG. 9A, which is a finite element model of the sensor 500 under force F1). By contrast, in some sensors that do not possess bend points and more particularly bend points in regions in which there side walls slope inwardly towards the base, there is a risk of the side walls resisting an activation force beyond a level that is acceptable.

The lower conductive portion 506 is shaped to have an engagement region 530, a first transition region 532 and a second transition region 534. The engagement region 530 is the portion of the conductive portion 506 that engages an engagement surface 531 on the upper conductive portion 508 so as to activate the sensor 500. The engagement region 530 is a plateau in the embodiment shown in FIG. 9. The first and second transition regions 532 and 534 are portions that control how much the side walls 518 and 520 can bend when the sensor 500 is subjected to a force F2 that is directed downwards towards the base 517, but at an angle AF in FIG. 9B which is a finite element model of the sensor 500 under force F2. The first and second (i.e. left and right) regions 532 and 534 slope downward from the central region towards the side walls at a selected angle. The selected angle, and the size and height of the engagement region 530 may be selected to provide a relatively large range of angles in which a selected magnitude of activation force can cause activation of the sensor 500. In an example, the transition regions 532 and 534 may have angles ANG1 and ANG2 of about 45 degrees with respect to a normal plane $P_N$ (i.e. a plane that is normal to the base 517) as shown in FIG. 9. Thus the force F2 may be at an angle of about 37.5 degrees on each side, as noted above, or some other angle that may be greater than or less than 37.5 degrees, such as, for example, about 45 degrees per side.

The plane $P_N$ is shown as an edge line in the cross-sectional views in the figures.

The base 517 of the sensor 517 may be made sufficiently stiff to avoid the likelihood of the entire sensor deforming under a force F2 in such a way that the first conductive portion 506 is urged laterally and avoids being contacted by the second conductive portion 510. In general, the first and second conductively portions 506 and 510 may be more stiff than the casing 512, due, in at least some embodiments to a relatively high carbon content in the portions 506 and 510 so as to enhance conductivity.

In general, in any of the embodiments shown herein, the combination of a conductor (e.g. wire 502a) and a conductive portion (e.g. 506) may together be referred to as an electrode.

Activation of the sensor 500 is carried out as follows. An activation force exerted downwards on the casing 512 by an obstacle causes engagement between the first and second electrodes so as to reduce the resistance therebetween, thereby activating the sensor.

In general, a purchaser of a sensor may specify that the sensor is to be activated by a force that is not more than a selected maximum acceptable magnitude. When a sensor is said to have a certain range of activation angles, it may be meant that the sensor will be activated by a force at an angle within that range, wherein the force is not more than the maximum acceptable magnitude. Providing the transition regions 532 and 534 at 45 degrees from the normal plane $P_N$ in general determines that the range of activation angles in which a force of not more than the selected maximum acceptable magnitude will cause sensor activation will be about 45 degrees from the normal plane $P_N$ if the side walls 518 and 520 are made sufficiently bendable. In some embodiments, the transition region angles may be larger than 45 degrees, depending on the width of the engagement region 530 and the spacing between the engagement region 530 and the upper conductive portion 510. The spacing, in some embodiments, may be about 1.1 mm.

Figure 10:
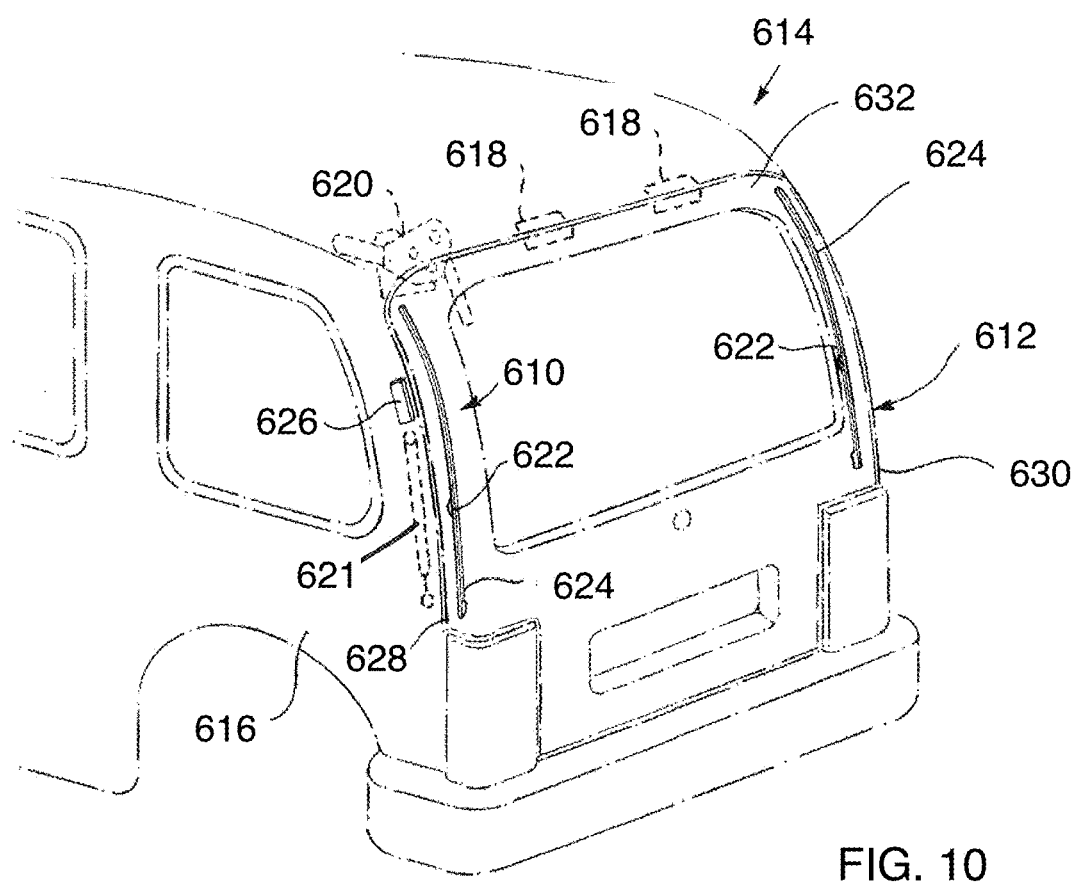
FIG. 10 is a perspective view illustrating an embodiment of an obstacle sensing system for a liftgate of a vehicle.
Figure 11:
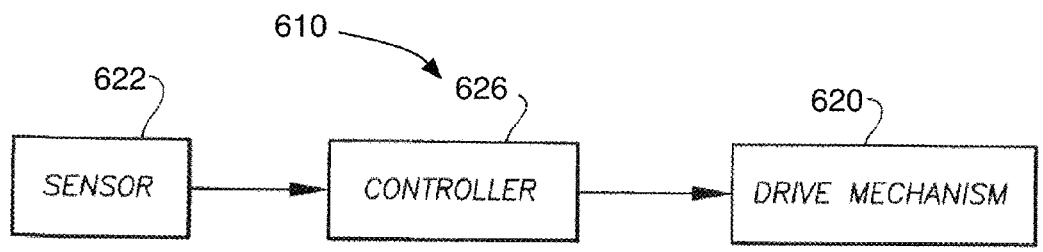
FIG. 11 is a block diagram illustrating functional components of the obstacle sensing system of FIG. 10.

Reference is made to FIG. 10, which shows an example of an obstacle sensing system 610 operatively associated with a liftgate 612 of a vehicle 614. FIG. 11 is a block diagram illustrating the obstacle sensing system 610. The liftgate 612 is one example of a closure panel that may be used with the system 610. It will be understood by those skilled in the art that the obstacle sensing system 610 may be used with other closure panels and windows of a vehicle.

Referring to FIG. 10 the liftgate 612 is mounted to a body 616 of the vehicle 614 through a pair of hinges 618 to pivot about a transversely extending pivot axis with respect to a large opening 601 (see FIG. 5) in the rear of the body 616. The liftgate 612 is mounted to articulate about the pivot axis between a closed position where the liftgate 612 closes the opening 601 and an open position where the liftgate 612 uncovers the opening 601 for free access to the vehicle body interior and assumes a slightly upwardly angled position above horizontal. The liftgate 612 is secured in its closed position by a latching mechanism (not shown). The liftgate 612 is opened and closed by a drive mechanism 620 with the optional assist of a pair of gas springs 621 connected between the liftgate 612 and the body 616. The drive mechanism 620 may be similar to that described in PCT International Patent Application No. PCT/CA2012/000870, filed Sep. 20, 2012, and incorporated herein by reference. The drive mechanism 620 may include a powered strut as described in U.S. Pat. No. 7,938,473, issued May 20, 2011, and incorporated herein by reference.

According to one embodiment, the obstacle sensing system 610 includes two obstacle sensors 622, a mounting channel or track 624 for each of the sensors 622, and a controller 626. The pair of sensors 622 are positioned proximate to laterally opposing sides 628 and 630 of the liftgate 612. Both of the sensors 622 include an upper end in close proximity to an upper lateral edge 632 of the liftgate 612. The sensors 622 extend downwardly from their upper ends along a substantial portion of the liftgate 612. The sensors 622 are both electrically attached to a wire harness 830 adapted to plug into the controller 626. The controller 626 controls the drive mechanism 620 to open the liftgate 612 in the event it receives an electrical signal from one or more of the sensors 622.

According to one embodiment, each of the sensors 622 is mounted to the liftgate 612 through a mounting track 624. The mounting tracks 624 may be substantially mirror images of one another. For this reason, only one of the mounting tracks 624 needs to be described herein. The mounting track 624 provides a mounting surface for the sensor 622 which can deflect after the sensor 622 compresses and sends a control signal to the controller 626. This deflection allows the controller 626 sufficient time to reverse the drive mechanism 620 without damaging the obstacle, the liftgate 612 or the drive mechanism 620. The mounting track 624 also provides a gradually changing surface to which the sensor 622 may be mounted. According to one embodiment, the sensors 622 are mounted to the mounting tracks 624, which are, in turn, attached to the liftgate 612. Alternatively, it will be understood that in certain applications it may be desirable to mount the sensors 622 and their associated tracks 624 on the body 616 of the vehicle 614 adjacent to the liftgate 612.

In operation, when the liftgate 612 contacts or approaches an obstacle proximate to the sensor 622 as is articulated towards the closed position such that a sufficient force is exerted by the obstacle on the sensor 622, the sensor 622 is activated. The activation of the sensor 622 is detected by the controller 626. In response, the controller 626 reverses the drive mechanism 620 to articulate the liftgate 612 to the open position.

The drive mechanism 620 is controlled in part by the obstacle sensing system 610. The obstacle sensing system 610 includes elongate sensors 622 that help prevent the liftgate 612 from pinching or crushing an obstacle such a person's finger (not shown) that may be extending through the opening 601 when the liftgate 612 lowers towards or nears the closed position. As noted above, it will be appreciated by those skilled in the art that the obstacle sensing system 610 may be applied to any motorized or automated closure panel structure that moves between an open position and a closed position. For example, a non-exhaustive list of closure panels includes window panes, sliding doors, tailgates, sunroofs and the like. For applications such as window panes or sun roofs, the elongate sensors 622 may be mounted on the body 616 of the vehicle 614, and for applications such as powered liftgates and sliding doors the elongate sensor 622 may be mounted on the closure panel itself, e.g. at the leading edge of a sliding door or the side edges of a liftgate 612.

Figure 12A:
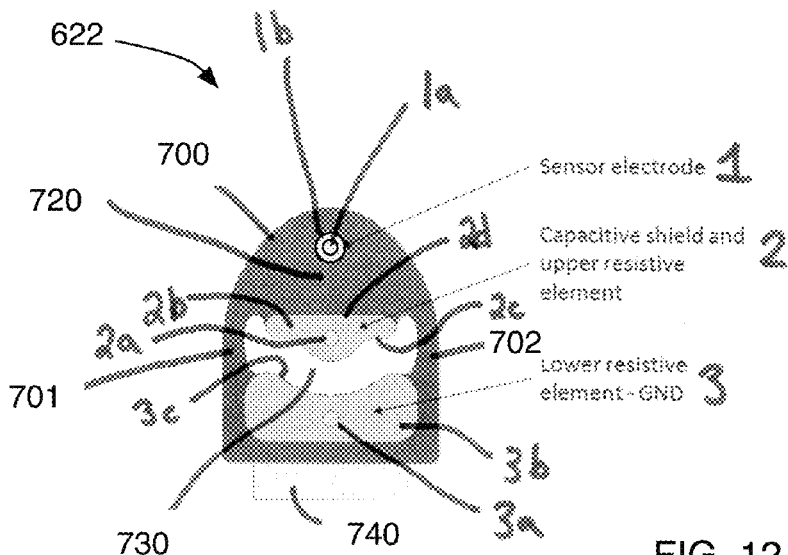
FIGS. 12a and 12b are cross-sectional views illustrating an embodiment of a capacitive-resistive hybrid pinch sensor for use in the obstacle detection system of FIG. 10.
Figure 12B:
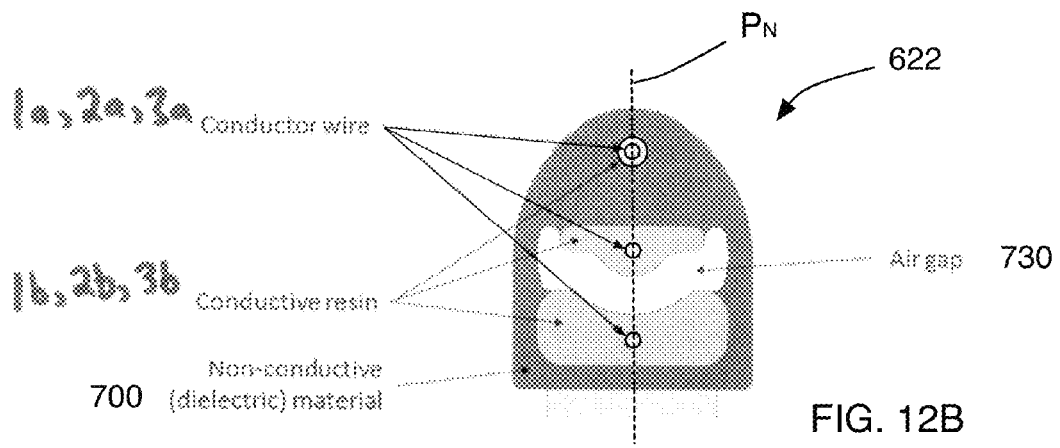
Figure 13:
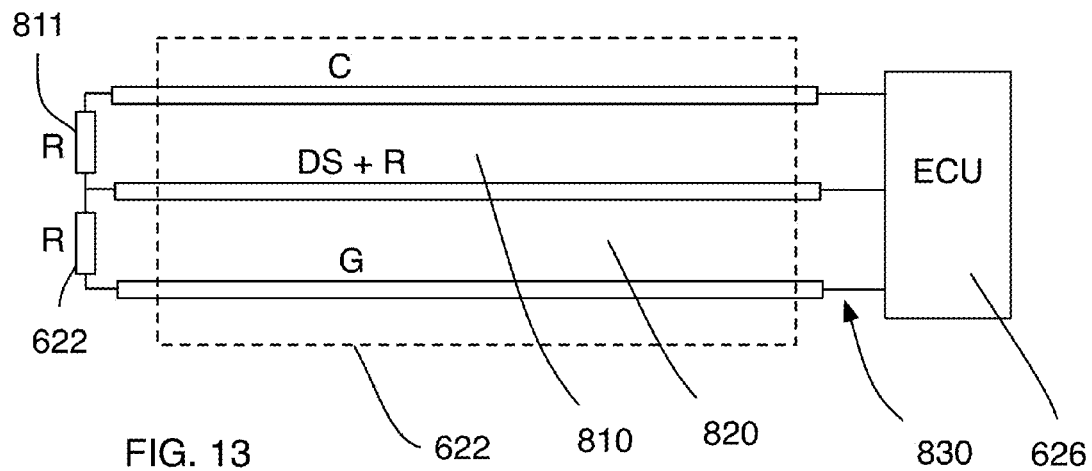
FIG. 13 is a wiring diagram illustrating connection of the sensor shown in FIGS. 12a and 12b to a controller.
Figure 14:
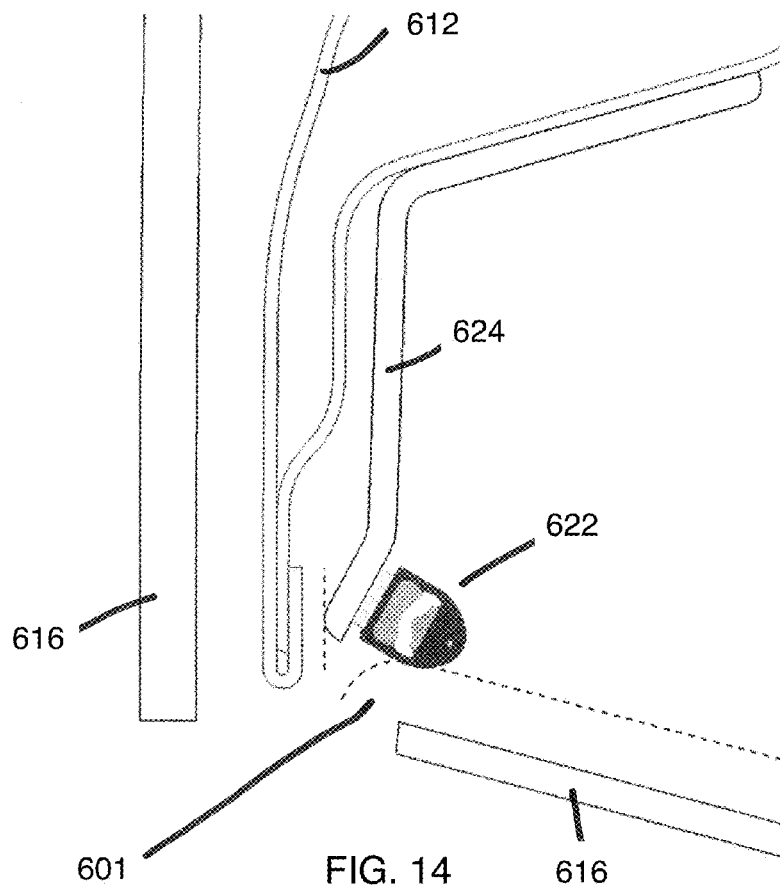
FIG. 14 is a view showing the pinch sensor of FIGS. 12a and 12b, installed in a vehicle.

FIGS. 12a and 12b are cross-sectional views illustrating an embodiment of the obstacle sensor 622. FIG. 13 is a cross-sectional view illustrating obstacle sensor 622 mounted on the liftgate 612. FIG. 14 is a wiring diagram illustrating connection of an obstacle sensor 622 to a controller 626 in accordance with some embodiments.

The obstacle sensor 622 is a hybrid three electrode sensor that allows for both a resistive mode and a capacitive mode of obstacle detection. The capacitive mode operates through the upper (first) and middle (second) electrodes 1, 2 or with all three electrodes 1, 2, 3. The resistive mode operates through the middle (second) and lower (third) electrodes 2, 3. In capacitive mode, the upper and middle electrodes 1, 2 function in a driven shield configuration (i.e., with the middle electrode 2 being the driven shield) with the lower electrode 3 being an optional ground. The casing 700 positions the three electrodes 1, 2, 3 in an arrangement that facilitates operation of the sensor 622 in both a capacitive mode and a resistive mode.

In capacitive mode, the upper electrode 1 (optionally comprising a conductor 1a embedded in conductive resin 1b) acts as a capacitive sensor electrode, and the middle electrode 2 (optionally comprising a conductor 2a embedded in conductive resin 2b) acts as a capacitive shield electrode. A dielectric 720 (e.g., a portion 720 of the casing 700) is disposed between the middle electrode 2 and the upper electrode 1 to isolate and maintain the distance between the two electrodes 2 and 1. The controller (or sensor processor ("ECU")) 626 is in electrical communication with the electrodes 1, 2 for processing sensed data received therefrom.

In resistive mode, the middle electrode 2 acts as an upper resistive element and the lower electrode 3 acts as a lower resistive element. The middle and lower electrodes 2, 3 are connected at one end of the sensor 622 to a pre-determined resistor 721 (FIG. 13) and at the other end to a wire harness 830 and the controller 626. The middle and lower electrodes 2, 3 are separated by an air gap 730 formed within the casing 700 and bounded by compressible or deflectable spring side walls 701, 702 of the casing 700. When an obstacle contacts the sensor 622 with enough force and within the activation angle range of the sensor 622, it deflects the upper portion of the sensor 622 and brings the middle and lower electrodes 2, 3 into contact. This lowers the resistance of the sensor 622 to a level that is detectable by the controller 626 which is in electrical communication with the middle and lower electrodes 2, 3 for processing sense data received therefrom.

According to one embodiment, the obstacle sensor 622 includes an elongate non-conductive casing 700 having three elongate conductive electrodes 1, 2, 3 extending along its length. The electrodes 1, 2, 3 are encapsulated in the casing 700 and are normally spaced apart. When the sensor 622 is compressed by a force exerted in a direction having not more than a selected angle relative to the normal plane $P_N$ shown in FIG. 12B by an obstacle, the middle and lower electrodes 2, 3 make contact so as to generate an electrical signal indicative of contact with the obstacle. When an obstacle comes between the tailgate 612 and the body 616 of vehicle 614, the presence of the obstacle affects the electric field generated by the upper electrode 1 which results in a change in capacitance between the upper and middle electrodes 1, 2 which is indicative of the proximity of the obstacle to the liftgate 612. Hence, the middle and lower electrodes 2, 3 function as a resistive contact sensor while the upper and middle electrodes 1, 2 function as a capacitive non-contact or proximity sensor.

According to one embodiment, the upper (first) electrode 1 may include a first conductor 1a embedded in a first partially conductive portion or body or sheath 1b, the middle (second) electrode 2 may include a second conductor 2a embedded in a second partially conductive portion or body or sheath 2b, and the lower (third) electrode 3 may include a third conductor 3a embedded in a third partially conductive portion or body or sheath 3b. The conductors 1a, 2a, 3a may be formed from a metal wire. The partially conductive bodies 1b, 2b, 3b may be formed from a conductive resin. And, the casing 700 may be formed from a non-conductive (e.g., dielectric) material (e.g., rubber, etc.). Again, the upper electrode 1 is separated from the middle electrode 2 by a portion 720 of the casing 700. The middle electrode 2 is separated from the lower electrode 3 by an air gap 730 formed in the casing 700.

According to one embodiment, the obstacle sensor 622 is mounted on the liftgate 612 as shown in FIGS. 10 and 14. The sensor 622 may be fastened to the liftgate 612 by an adhesive tape 740 provided along the base of the sensor's casing 700.

According to one embodiment, the casing 700 may be formed as an extruded, elongate, elastomeric trim piece with co-extruded conductive bodies 1b, 2b, 3b and with the conductors 1a, 2a, 3a molded directly into the bodies 1b, 2b, 3b. The trim piece may be part of the liftgate water sealing system, i.e., form part of a seal, it may form part of the decorative fascia of the vehicle 614, or it may form part of the interior trim of the liftgate 612.

As shown in FIG. 13, a capacitive sensor circuit 810 is formed by the capacitive sensor electrode 1, a first terminal resistor 811, and the capacitive shield/upper resistive sensor electrode 2. In addition a resistive sensor circuit 820 is formed by the capacitive shield/upper resistive sensor electrode 2, a second terminal resistor 721, and the lower resistive sensor electrode 3. The resistors 811 and 721 are diagnostic resistors for the sensor circuits 810, 820. Both the capacitive sensor circuit 810 and the resistive sensor circuit 820 are coupled to and driven by the controller 626.

With respect to resistive sensing, the air gap 730 electrically insulates the middle electrode 2 and the lower electrode 3. However, the spring side walls 701, 702 of the sensor casing 700 are flexible enough to enable the outer surfaces 2c, 3c of the partially conductive bodies 2b, 3b of the two electrodes 2, 3 to touch one another when the sensor 622 is compressed (e.g., as a result of a pinch event). The flexibility of the sensor 622 may be controlled by its cross-sectional configuration, including controlling the thickness of the side walls 701, 702 of the casing 700 and the thickness of the partially conductive bodies 2b, 3b. The outer surfaces 2c, 3c of the partially conductive bodies 2b, 3b are shaped to increase the activation angle (i.e., the angle from the normal at which a compressive or pinch force is applied to the sensor 622) of the sensor 622. According to one embodiment, the outer surface 2c of the middle electrode 2 may have a ball shape and the outer surface 3c of lower electrode 3 may have a socket shape as shown in FIGS. 12A and 12B.

The controller 626 measures the resistance (or resistance value) between the middle electrode 2 and the lower electrode 3. The resistance will be large in magnitude when the partially conductive bodies 2b, 3b are separated from each other by the air gap 730, and will reduce in magnitude if a portion of the partially conductive bodies 2b, 3b contact one another when the sensor 622 is compressed. This drop in measured resistance is indicative of contact with an obstacle (i.e., a pinch event).

With respect to capacitive sensing, a portion 720 of the casing 700 electrically insulates the upper electrode 1 and the middle electrode 2 so that electrical charge can be stored therebetween in the manner of a conventional capacitor. According to one embodiment, the inner surface 2d of the middle electrode 2 may be shaped to improve the shielding function of the middle electrode 2. According to one embodiment, the inner surface 2d may be flat as shown in FIGS. 12A and 12B.

The sensor 622 is used by the controller 626 to measure a capacitance (or capacitance value) of an electric field extending through the opening 601 under the liftgate 612. According to one embodiment, the middle electrode 2 functions as a shielding electrode since it is positioned closer to the sheet metal of the liftgate 612. As such, the electric field sensed by the upper electrode 1 will be more readily influenced by the closer middle electrode 2 than the vehicle sheet metal. To improve signal quality, the liftgate 612 may be electrically isolated from the remainder of the vehicle 614. A powered sliding door, for example, may be isolated through the use of non-conductive rollers.

The capacitance (or capacitance value) of the sensor 622 is measured as follows. The capacitive sensor electrode 1 and the capacitive shield/upper resistive sensor electrode 2 are charged by the controller 626 to the same potential using a pre-determined pulse train. For each cycle, the controller 626 transfers charge accumulated between the electrodes 1, 2 to a larger reference capacitor (not shown), and records an electrical characteristic indicative of the capacitance of the sensor 622. The electrical characteristic may be the resultant voltage of the reference capacitor where a fixed number of cycles is used to charge the electrodes 1, 2, or a cycle count (or time) where a variable number of pulses are used to charge the reference capacitor to a predetermined voltage. The average capacitance of the sensor 622 over the cycles may also be directly computed. When an obstacle enters the opening 601 under the liftgate 612, the dielectric constant between the electrodes 1, 2 will change, typically increasing the capacitance of the sensor 622 and thus affecting the recorded electrical characteristic. This increase in measured capacitance is indicative of the presence of the obstacle (i.e., the proximity of the obstacle to the liftgate 612).

Figure 15:
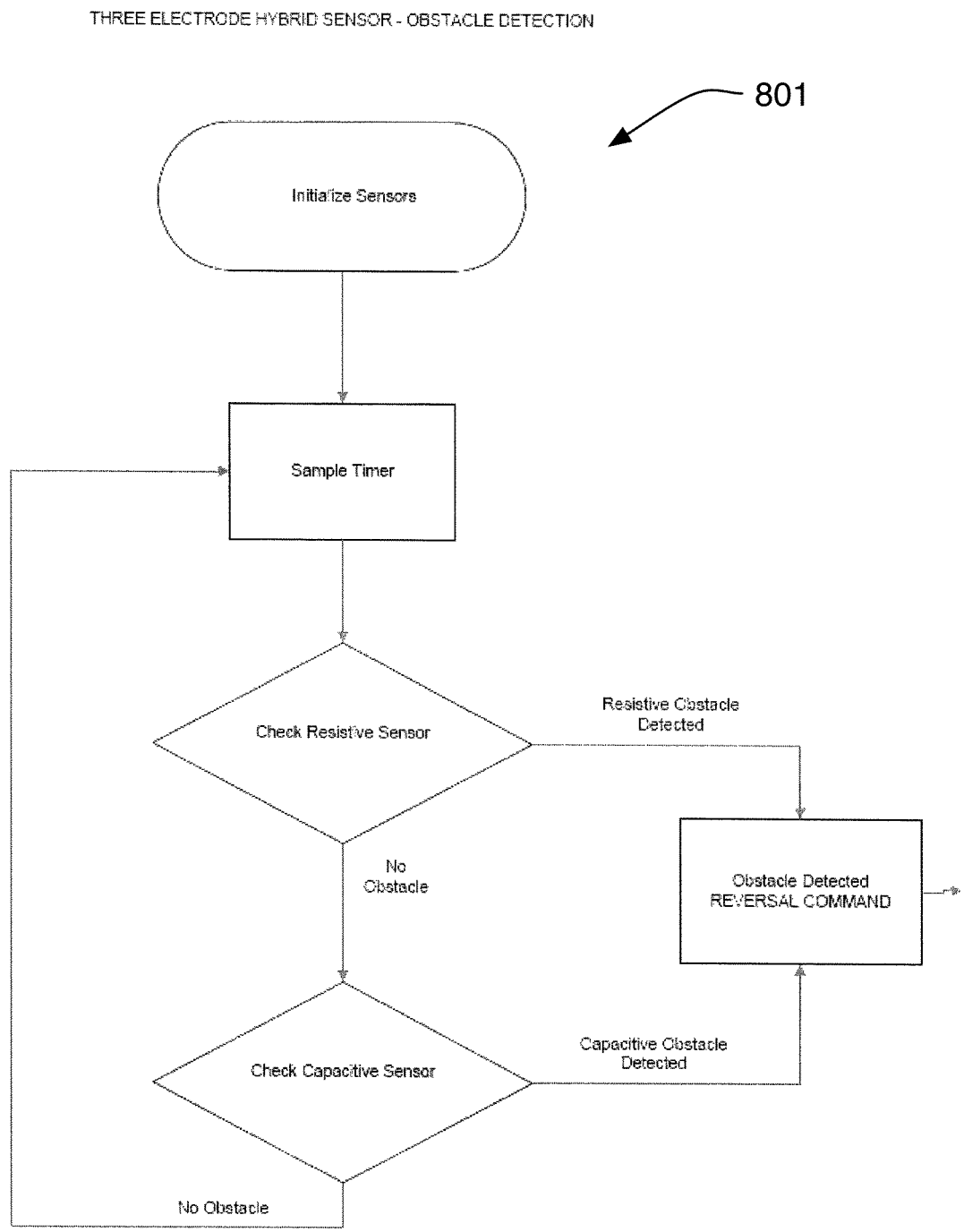
FIG. 15 is a flow diagram illustrating operations of modules within the obstacle sensing system.

FIG. 15 is a flow chart illustrating a method 801 of operations of modules within an obstacle sensing system 610 for detecting contact with or proximity of an obstacle. According to one embodiment, as shown in FIG. 15, the obstacle sensing system 610 may uses both capacitive and resistive sensing modes to detect contact with or proximity of an obstacle. Software modules within the controller 626 may toggle between resistive and capacitive sensing operations.

Thus, according to one embodiment, there is provided an obstacle sensor 622, comprising: an elongate non-conductive casing 700 enclosing first, second, and third elongate conductive electrodes 1, 2, 3; the first and second electrodes 1, 2 being separated by a portion 720 of the casing 700, a capacitance between the first and second electrodes 1, 2 changing when an obstacle approaches the first electrode 1 to provide a proximity indication of the obstacle to the pinch sensor; and, the second and third electrodes 2, 3 being separated by an air gap 730 formed in the casing 700, a resistance between the second and third electrodes 2, 3 changing when the second and third electrodes 2, 3 come into contact with one another upon compression of the casing 700 by the obstacle, thereby providing an indication of contact of the obstacle with the pinch sensor.

The embodiments of the sensor 622 may contribute to an improved obstacle sensor and may provide one or more advantages. For example, by detecting proximity of an obstacle by capacitive sensing, overloading of the sensor 622 and the pinched obstacle during the time lag encountered by the powered opening of the liftgate 612 is reduced. Additionally, the sensor 622 allows for the use of resistive contact sensing as a back-up to capacitive proximity sensing.

Figure 16:
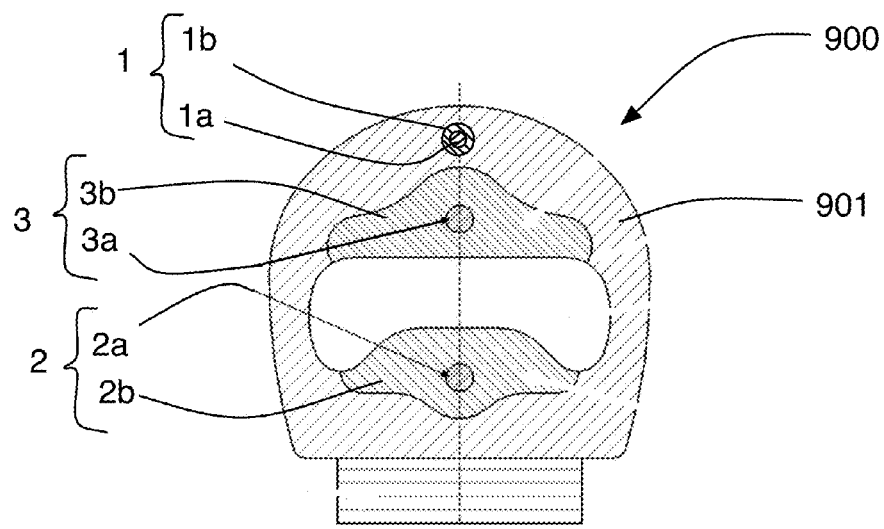
FIG. 16 is a cross-sectional view illustrating another embodiment of a capacitive-resistive hybrid pinch sensor.

In an alternative embodiment, the sensor 500 shown in FIG. 10 may instead be configured to be a hybrid sensor having three electrodes instead of two electrodes, thereby permitting the sensor 500 to be used both as a capacitive sensor and a resistive sensor. For example, as shown in FIG. 16, a sensor 900 is shown having a similar configuration to the sensor 500 shown in FIG. 9, but which contains first, second and third electrodes 1, 2 and 3, which function in capacitive or resistive modes as described above in relation to FIGS. 10-15. The electrode 1 may include wire 1a and conductive portion or body or sheath 1b that is embedded in casing 901. The second and third electrodes 2 and 3 may be similar to the first and second electrodes in the embodiment shown at 500 in FIG. 9.

Figure 17:
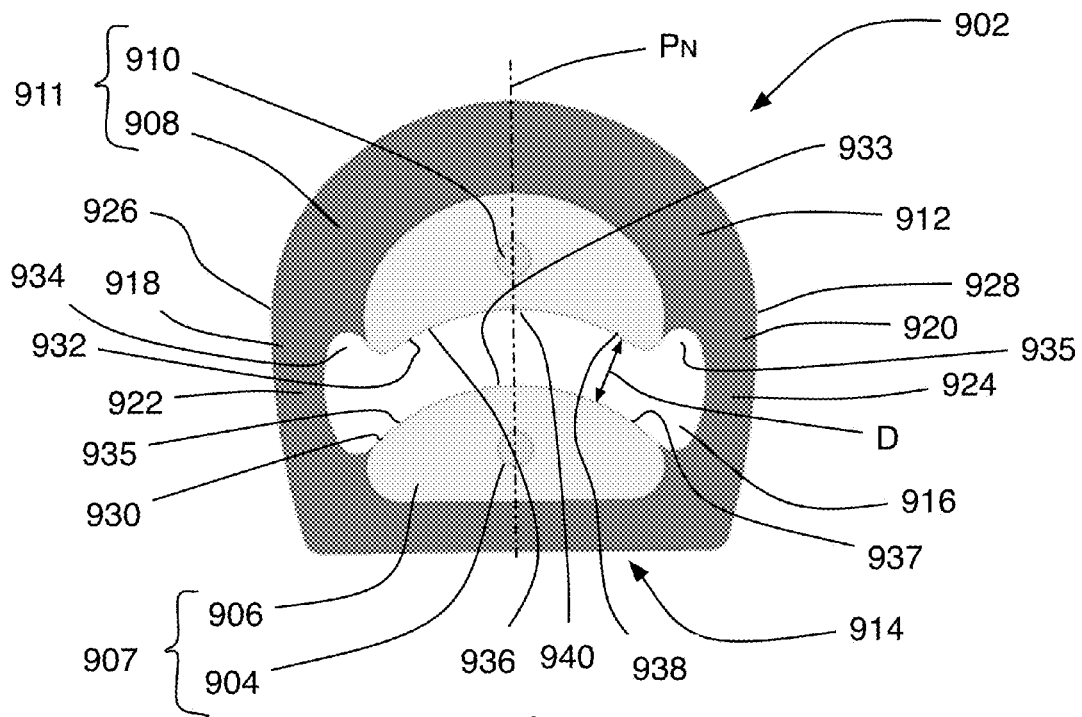
FIG. 17 is a cross-sectional view illustrating another embodiment of a resistive pinch sensor.

Reference is made to FIG. 17 which shows a sensor 902 that may be used as part of the obstacle detection system 610 (FIG. 11). The sensor 902 is a resistive sensor that includes a first wire 904 embedded in a first conductive portion or body or sheath 906 which together form a first electrode 907, a second wire 908 embedded in a second conductive portion or body or sheath 910, which together form a second electrode 911, and a casing 912. The casing 912 has a base 914 which optionally has a foam tape or the like thereon to mount the sensor 902 to an element such as a closure panel in a vehicle. The sensor 902 has an air gap 916 between the first and second electrodes 907 and 911 and first and second side walls 918 and 920 with bend points 922 and 924 respectively that are on portions of the side walls 918 and 920 that are below lateral maxima 926 and 928.

The engagement region of the first conductive portion 906 (which is the engagement region of the first electrode 907, and which is shown at 930) may be generally arcuate and may include a central (curved) region 933 on the normal plane $P_N$ and left and right lateral regions 935 and 937 (one on either side of the central region 933) which slope lower than the central region. The engagement region 930 is at a generally constant spacing D from the engagement region shown at 932 of the second electrode 911, which is also arcuate. The arcuate shape, combined with the generally constant spacing D, permits a generally consistent activation distance (i.e. the distance between the point at which the casing 902 is first engaged with an obstacle and the point at which the two electrodes 907 and 911 engage each other causing activation of the sensor 902). The spacing D may remain between about 1 mm to about 1.3 mm along the entirety of the engagement regions 930 and 932.

In similar manner to the lower engagement surface 930, the upper engagement surface 932 includes left and right lateral regions 936 and 938 that extend downwardly towards the lower conductive portion 906, as compared to a central region 940 along the normal plane $P_N$. In general, this permits providing a more consistent activation distance than is achieved with the sensor 500 which has an upper engagement surface 531 that is generally planar.

It will be noted that there are areas of relief (also referred to for convenience as notches) 934 and 935 on the sides of the second conductive portion 910, between the conductive portion 910 and each of the side walls 918 and 920. These notches 934 and 935 permit the spacing D between the two conductive portions 906 and 910 to be relatively small while still maintaining a selected height for the side walls 918 and 920, such that the side walls have a height that is greater than the spacing D.

Thus, with the configuration shown in FIG. 17, the height of the spacing D need not be restricted because of a limitation on the height of the side walls 918 and 920 needed to impart a selected amount of flexibility, permitting the spacing D to be controlled independently of the height of the side walls 918 and 920. In some embodiments, the activation angle (i.e. the range of activation angles) for the embodiment shown in FIG. 17 may be 110 degrees (i.e. 55 degrees per side), or even 130 degrees (i.e. 65 degrees per side) or higher. In general a higher range of activation angles is beneficial in order to ensure that the sensor is activated under a wider range of positions of an obstacle.

Figure 17A:
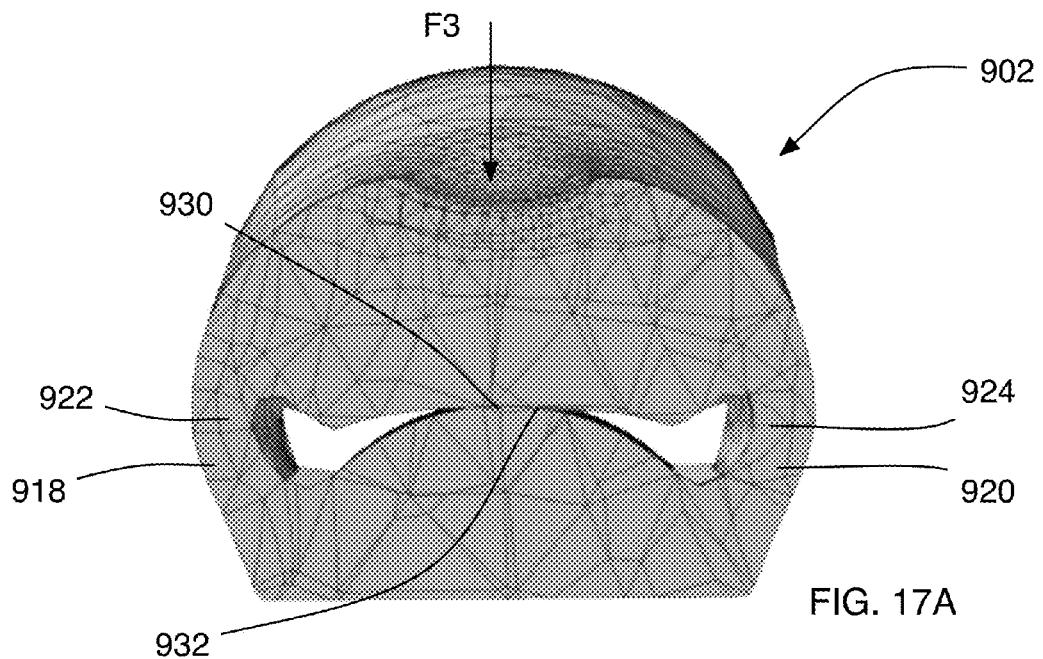
FIGS. 17A and 17B are finite element models illustrating the deformation of the pinch sensor shown in FIG. 17 under different loads.
Figure 17B:
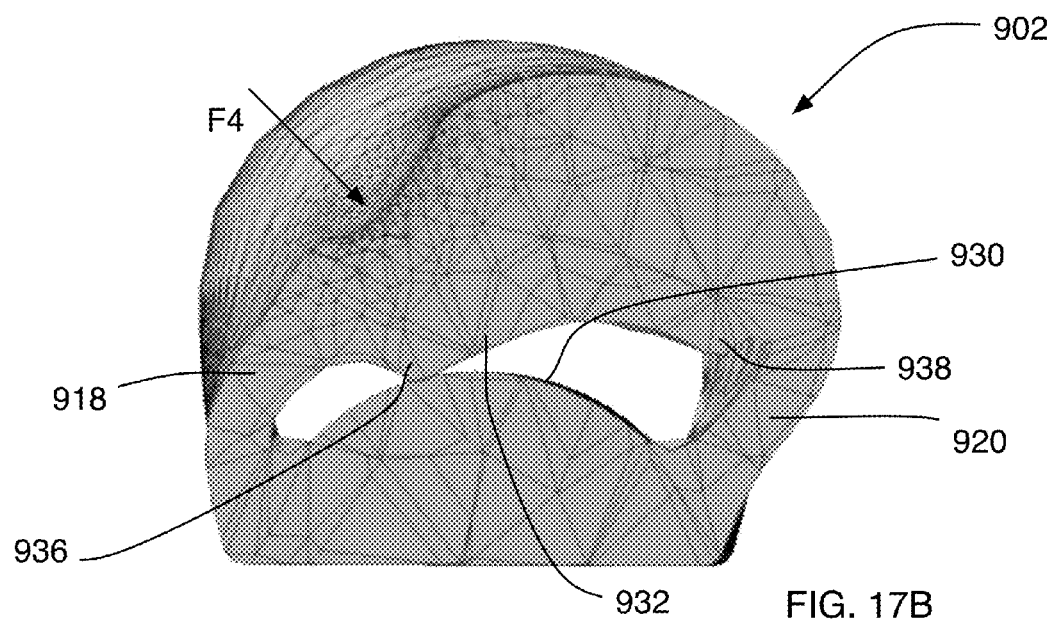

FIG. 17A shows the sensor 902 incurring a force F1 that is generally parallel to the normal plane $P_N$. FIG. 17b shows the sensor 902 incurring a force F2 that is at some angle to the normal plane $P_N$. in general, the distance traveled (and the force needed) to cause activation of the sensor 902 may be generally constant over substantially the entire range of activation angles.

Figure 18:
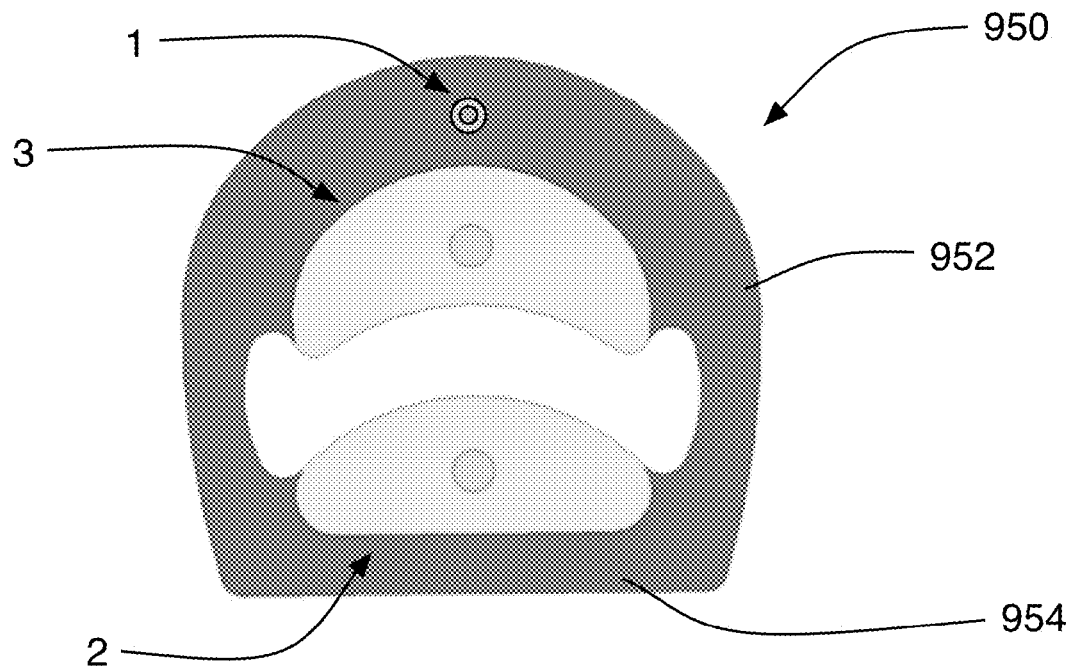
FIG. 18 is a cross-sectional view illustrating another embodiment of a capacitive-resistive hybrid pinch sensor.

Reference is made to FIG. 18, which shows another embodiment of a sensor 950. The sensor 950 may be similar to the sensor 902, but may include first, second and third electrodes 1, 2 and 3, wherein electrodes 1 and 2, or 1, 2 and 3 are used for capacitive sensing and electrodes 2 and 3 are used for resistive sensing. The sensor 950, further includes a casing 952 that, aside from having the electrode 1 therewithin, may be similar to the casing 912 from sensor 902. The base of casing 952, shown at 954, may have foam tape (not shown) thereon for mounting the sensor 950 to a vehicle 914 (FIG. 10).

Figure 19:
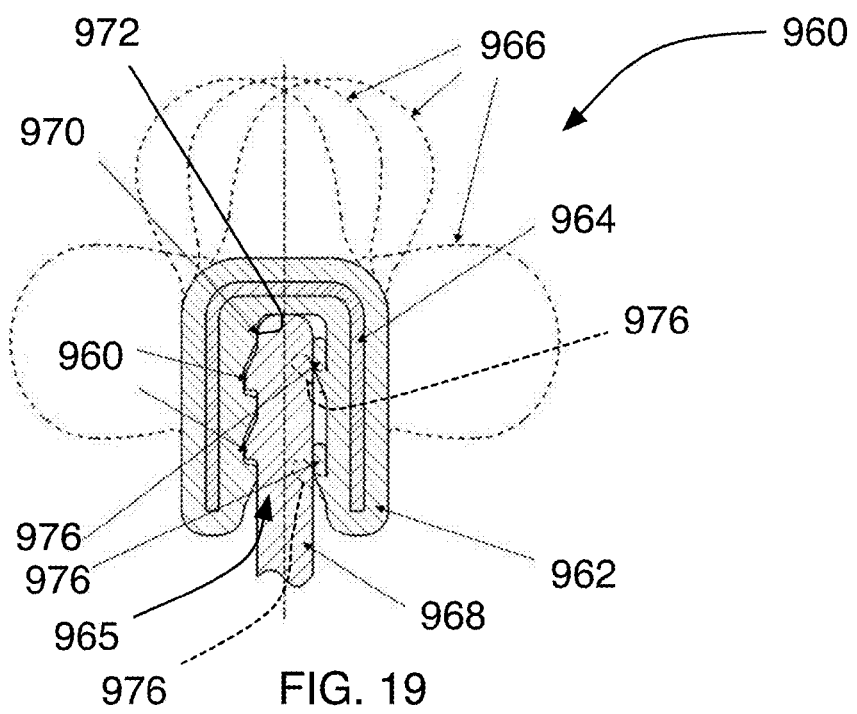
FIG. 19 is a cross-sectional view illustrating an embodiment of a mounting member for any of the pinch sensors shown and described.

In general, while foam tape is an example of a mounting member that can be used to mount one of the sensors described herein, any other suitable means for mounting the sensors to an element in the vehicle may be used. An example of a different mounting member is shown at 960 in FIG. 19. The mounting member has a "U" shaped body 962, with a reinforcement member 964 embedded therein. The body 962 defines a slot 965. The sensor itself is shown at 966, however the sensor 966 may be any one of the sensors described herein. The sensor 966 connects to a sensor carrier 968 which mounts to an element of the vehicle. Thus the sensor 966 mounts to an element of the vehicle via the sensor carrier 968. The sensor carrier 968 has a lead-in portion 970 which mates snuggly with an end portion 972 of the slot 965 to keep the sensor 966 firmly in position. The mounting member 960 further includes a plurality of hook features 974 on one side wall of the slot 965 that retain the sensor 966 on the carrier 968, preventing the sensor 966 from falling off. On the other side wall of the slot 965 are a plurality of elastic fins 976. The fins 976 are shown in their extended position in dashed outline and in solid lines in their compressed position. The fins 976 act as biasing members that urge the other side wall of the slot 965 into firm engagement with the adjacent side wall of the carrier 968, so as to ensure a tight fit between the sensor 966 and the carrier 968.

Many other variations of the mounting member 960 could alternatively be used to mount the sensor 966 to an element of the vehicle.

Figure 20:
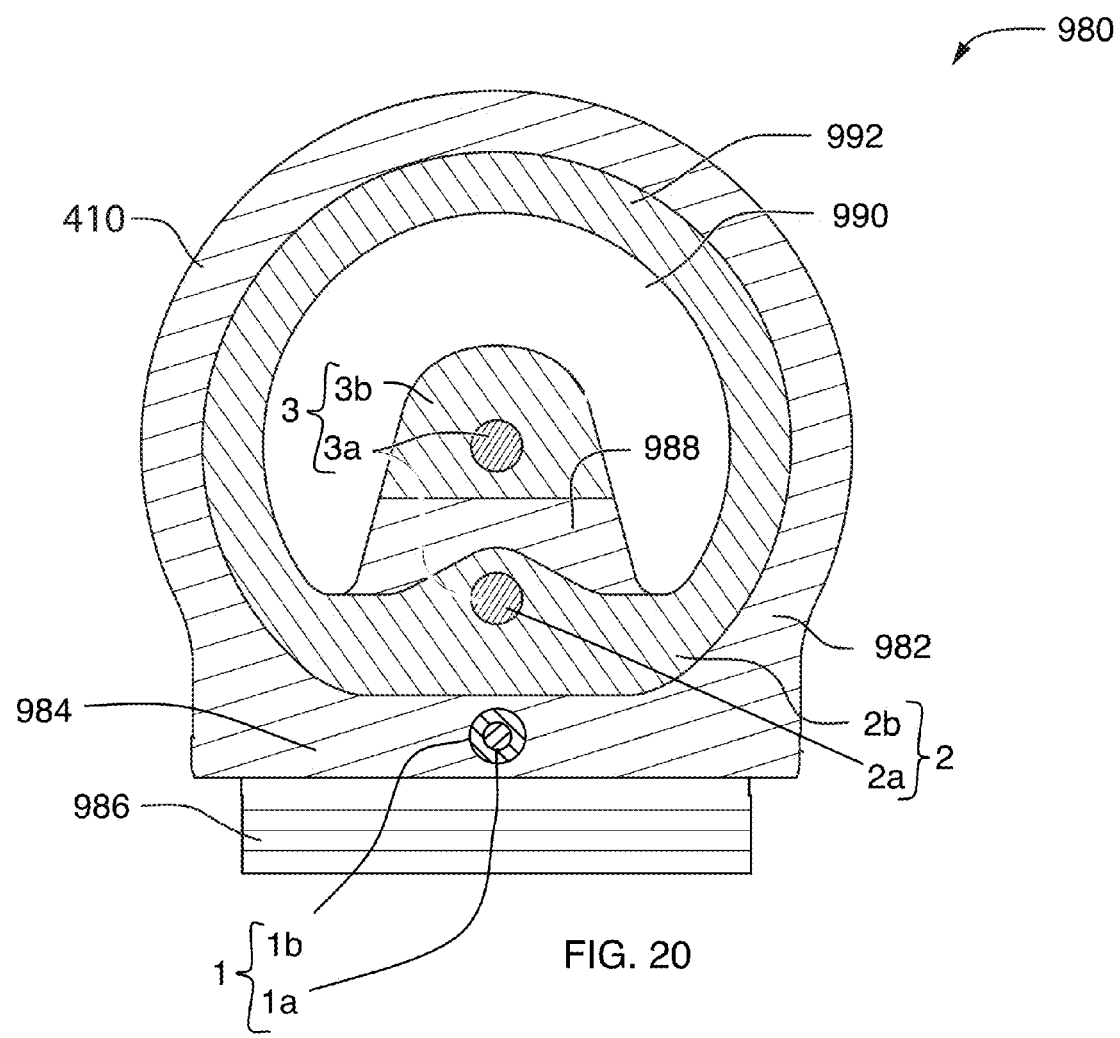
FIG. 20 is a cross-sectional view illustrating another embodiment of a capacitive-resistive hybrid pinch sensor.

Reference is made to FIG. 20 which shows another embodiment of a sensor 980. The sensor 980 may be similar to the sensor 400 (FIG. 7), but may include first, second and third electrodes 1, 2 and 3, wherein electrodes 1 and 2, or 1, 2 and 3 are used for capacitive sensing and electrodes 2 and 3 are used for resistive sensing. The sensor 980, further includes a casing 982 that, aside from having the electrode 1 therewithin, may be similar to the casing 410B shown in FIG. 7 from sensor 400. The base of casing 982, shown at 984, may have foam tape 986 thereon for mounting the sensor 980 to a vehicle 914 (FIG. 10). The third electrode 3 is mounted on the second electrode 2 via an insulative layer 988 which may be similar to insulative layer 406 (FIG. 7). An air gap, shown at 990, may be similar to air gap 408 (FIG. 7), and separates the third electrode 3 from the part-circular portion 992 from the second conductive portion 2b from the second electrode 2.

While FIGS. 10 and 14 show portions of a vehicle 614 that can use the sensor 622, it will be noted that the vehicle 614 could alternatively use any of the sensors described herein. Similarly, the obstacle detection system 610 has been shown to use sensor 622, however, any of the sensors described herein could be part of the obstacle detection system 610. In embodiments wherein the sensor is a resistive sensor (e.g. sensor 500) the system 610 need not include a resistor 811 and would not include circuit 810.

When describing the figures of this disclosure, use of terms relating to direction such as 'up', 'upwards' and 'upper' are intended to describe a direction that is away from a base of a sensor, and terms such as 'down', 'downwards' and lower' are intended to describe a direction that is towards a base of a sensor. Similarly, terms such as 'higher' and lower' refer to relative distances to a base of a sensor, wherein 'higher' means 'farther from the base' along the normal plane to the base.

It will be noted that, in each embodiment of a sensor having three electrodes and both capacitive and resistive sensing capability, one of the three electrodes (e.g. electrode 1) is provided in the wall of the casing itself, and two of the three electrodes (e.g. electrodes 2 and 3) are positioned in an interior space provided in the casing.

Those skilled in the art will understand that a variety of modifications may be effected to the embodiments described herein without departing from the scope of the appended claims.

The invention claimed is:

1. A pinch sensor, comprising:
   an elongate non-conductive casing enclosing first, second, and third elongate conductive electrodes;
   the first and second electrodes being separated by a portion of the casing, a capacitance between the first and second electrodes changing when an obstacle approaches the first electrode to provide a proximity indication of the obstacle to the pinch sensor; and,
   the second and third electrodes being separated by an air gap formed in the casing, a resistance between the second and third electrodes changing when the second and third electrodes come into contact upon compression of the casing by the obstacle to provide a contact indication of the obstacle with the pinch sensor.

2. A pinch sensor as claimed in claim 1, wherein the first electrode is encased in a wall of the casing, and the second and third electrodes are positioned in an interior space provided in the casing.

3. A pinch sensor as claimed in claim 2, wherein the casing has side walls between the second and third electrodes,
   and wherein the second electrode has a central region that is a plateau, and left and right regions that slope downward towards the base in a direction away from the central region at a selected angle.

4. A pinch sensor as claimed in claim 2, wherein the third electrode has an engagement region which has a central region, and left and right regions that extend downward towards the first electrode relative to the central region towards the side walls.

5. A pinch sensor as claimed in claim 2, wherein
the casing is tubular,
wherein the second electrode includes an electrically-conductive tubular conduit disposed within the tubular casing,
and wherein the third electrode includes an electrically-conductive core disposed within the electrically-conductive tubular conduit and normally spaced apart from the tubular conduit.

* * * * *